US012731986B2

(12) United States Patent
Chen et al.

(10) Patent No.: US 12,731,986 B2
(45) Date of Patent: Sep. 8, 2026

(54) ELECTROSTATIC DISCHARGE PROTECTION

(71) Applicant: Taiwan Semiconductor Manufacturing Company, Ltd., Hsinchu (TW)

(72) Inventors: Chia-Hui Chen, Hsinchu City (TW); Chia-Jung Chang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 200 days.

(21) Appl. No.: 18/787,757

(22) Filed: Jul. 29, 2024

(65) Prior Publication Data

US 2024/0388081 A1 Nov. 21, 2024

Related U.S. Application Data

(63) Continuation of application No. 17/865,809, filed on Jul. 15, 2022, now Pat. No. 12,100,947.

(60) Provisional application No. 63/328,105, filed on Apr. 6, 2022.

(51) Int. Cl.
*H02H 9/04* (2006.01)
*H10D 89/60* (2025.01)

(52) U.S. Cl.
CPC ........... *H02H 9/046* (2013.01); *H10D 89/811* (2025.01)

(58) Field of Classification Search
CPC ............................. H02H 9/046; H10D 89/811
See application file for complete search history.

(56) References Cited

U.S. PATENT DOCUMENTS 6,906,387 B1 6/2005 Reese et al.
7,394,630 B2 7/2008 Ker et al.
10,897,131 B2 1/2021 Liao et al.
(Continued)

FOREIGN PATENT DOCUMENTS

CN 106451385 B 2/2017
CN 110120659 B 8/2019
(Continued)

OTHER PUBLICATIONS

Notice of Allowance on U.S. Appl. No. 17/865,809 Dtd May 21, 2024.

(Continued)

*Primary Examiner* — Scott Bauer
(74) *Attorney, Agent, or Firm* — Foley & Lardner LLP

(57) ABSTRACT

A semiconductor device includes a conductive layer extending along a first lateral direction; a gate dielectric layer disposed over the conductive layer; a channel layer disposed over the gate dielectric layer and extending along a second lateral direction perpendicular to the first lateral direction; a first via-like structure, in direct contact with the channel layer, that is disposed along a first edge of the channel layer extending along the second lateral direction; and a second via-like structure, in direct contact with the channel layer, that is disposed along a second, opposite edge of the channel layer extending along the second lateral direction. The first via-like structure and second via-like structure are laterally separated apart along a third lateral direction that is clockwise tilted from the second lateral direction with a first positive angle.

20 Claims, 21 Drawing Sheets

(56) References Cited

U.S. PATENT DOCUMENTS

| | | | | |
|---|---|---|---|---|
| 11,664,800 | B1 | 5/2023 | Akurathi et al. | |
| 2008/0218920 | A1* | 9/2008 | Vanysacker .......... | H10D 89/601 361/56 |
| 2009/0097174 | A1* | 4/2009 | Ker ...................... | H10D 89/811 361/56 |
| 2011/0255200 | A1* | 10/2011 | Tsai ....................... | H02H 9/046 361/56 |
| 2013/0293993 | A1* | 11/2013 | Chen ...................... | H02H 9/046 361/56 |
| 2014/0218097 | A1* | 8/2014 | Barrenscheen ........ | H03K 17/18 327/379 |
| 2016/0241020 | A1 | 8/2016 | Tseng et al. | |
| 2020/0266187 | A1 | 8/2020 | Meng et al. | |
| 2021/0281066 | A1 | 9/2021 | Lee et al. | |
| 2021/0313801 | A1* | 10/2021 | Albertini ............. | H02M 1/0006 |
| 2022/0416536 | A1* | 12/2022 | Krishnamoorthy ...... | H02H 9/02 |
| 2023/0215861 | A1 | 7/2023 | Chen et al. | |

FOREIGN PATENT DOCUMENTS

| | | | |
|---|---|---|---|
| CN | 112421592 | A | 2/2021 |
| CN | 113036742 | A | 6/2021 |
| CN | 113381394 | A | 9/2021 |
| JP | 2008-154400 | A | 7/2008 |
| TW | 201904158 | A | 1/2019 |
| TW | 201906132 | A | 2/2019 |

OTHER PUBLICATIONS

Taiwan Office Action issued in connection with TW Appl. Ser. No. 111138708 dated May 9, 2023.

* cited by examiner

130B"

OUTPUT DEVICES 1120

1125C

HOST DEVICE 1105

CPU CORE 1130N

CPU CORE 1130A

STANDARD CELL APPLICATION 1135

1125A

MEMORY DEVICE 1110

MEMORY CONTROLLER 1140

MEMORY ARRAY 1145

1125B

INPUT DEVICES 1115

1100

ELECTROSTATIC DISCHARGE PROTECTION

CROSS-REFERENCE TO RELATED APPLICATION

This application is a continuation application of U.S. patent application Ser. No. 17/865,809, filed on Jul. 15, 2022, which claims priority to U.S. Patent Provisional Application No. 63/328,105, filed on Apr. 6, 2022, each of which is incorporated herein by reference in its entirety.

BACKGROUND

Electrostatic discharge (ESD) is a sudden release of electrical charges from a person or an object to another device. For example, electrical charges built or stored by a person can be discharged to an electronic device. Discharging of a large amount of electrical charges can cause a large voltage or current, which can damage the electronic device and render the electronic device inoperable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
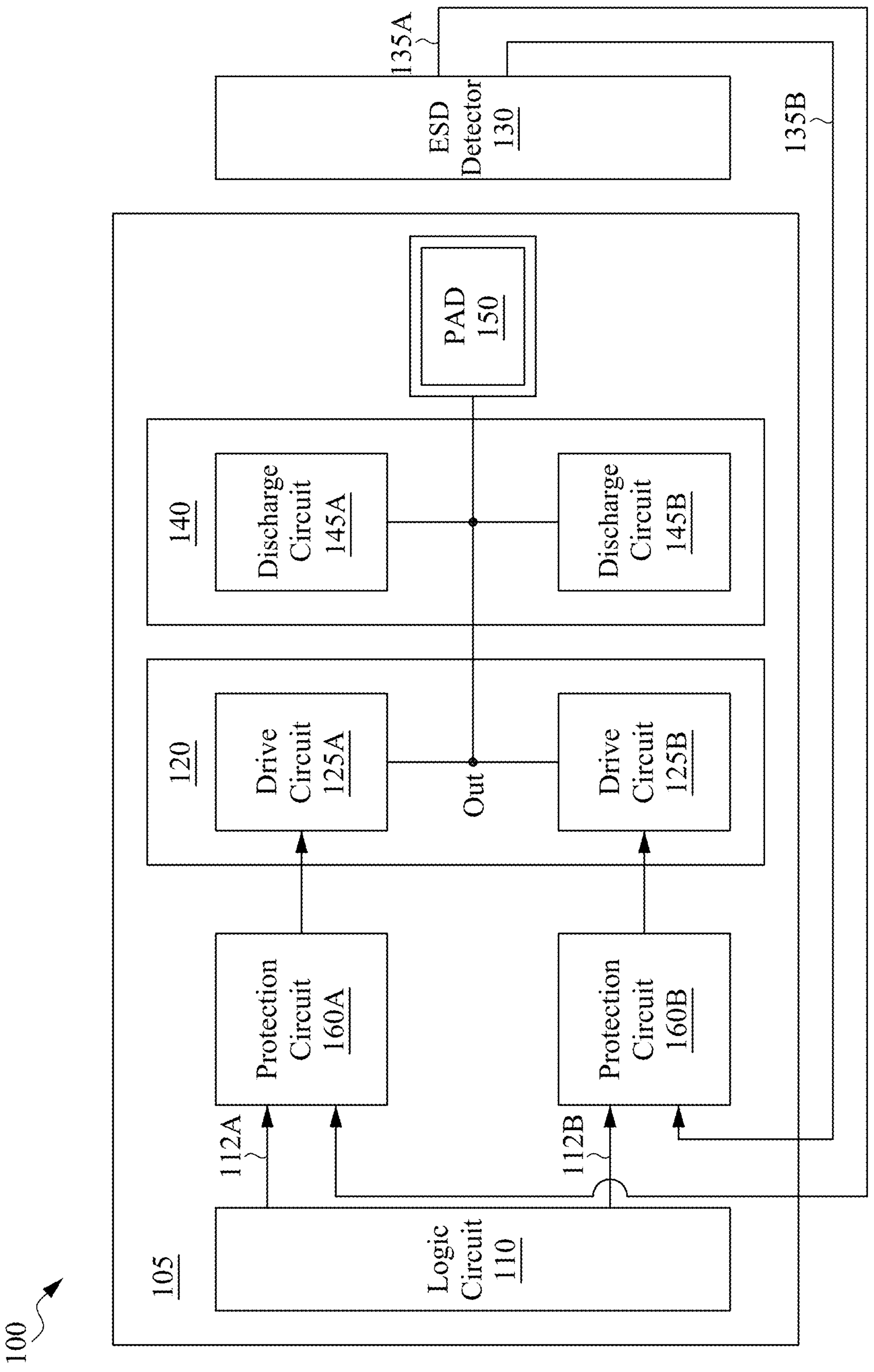
FIG. 1 is a diagram of an electronic device with an ESD protection, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to protecting an electronic device from an ESD. In one aspect, the device includes an ESD detector to detect an ESD at a pad. In some embodiments, the device includes a drive circuit. The drive circuit may be an overdrive circuit that can generate an output signal having an amplitude larger than a supply voltage of other circuits (e.g., logic circuits) in the device or a supply voltage for which transistors of circuits in the device are designed to operate. The drive circuit may include P-type transistors and N-type transistors connected in series with each other. In one aspect, the drive circuit is configured to provide an output signal swinging between a first supply voltage and a first reference voltage to the pad. In one aspect, the device includes a first protection circuit operating in a power domain between the first supply voltage and a second reference voltage. In response to the ESD detected by the ESD detector, the first protection circuit may be configured to disable the P-type transistors of the drive circuit to protect the P-type transistors from the ESD. In one aspect, the device includes a second protection circuit operating in another power domain between a second supply voltage and the first reference voltage. The second supply voltage may be lower than the first supply voltage. In response to the ESD detected by the ESD detector, the second protection circuit may be configured to disable the N-type transistors of the drive circuit to protect the N-type transistors from the ESD.

Advantageously, the drive circuit can generate an output signal having an amplitude larger than a supply voltage of other circuits (e.g., logic circuits) in the device at a pad, where the protection circuit and the ESD detector can operate together to protect the drive circuit. An output signal with an amplitude larger than the supply voltage of other circuits can help improve a signal integrity. In one aspect, the drive circuit may include P-type transistors and N-type transistors connected in series. The transistors stacked or connected in series can generate the output signal with the amplitude larger than the supply voltage of other circuits. In case the ESD is detected, the protection circuits can disable the transistors of the drive circuit. For example, a protection circuit can apply a bias voltage to turn off a transistor coupled to a metal rail configured to provide a supply voltage or a reference voltage. For example, a protection circuit can cause a gate electrode of a cascode transistor coupled to the pad to be floated, such that the cascode transistor may not conduct current. Hence, a large voltage stress due to the ESD can be distributed among the disabled transistors connected in series, such that the transistors of the drive circuit can be protected from the ESD.

FIG. 1 is a schematic diagram of an electronic device 100 with an ESD protection, in accordance with various embodiments. In some embodiments, the electronic device 100 can be a communication device, a computing device, or any electronic device. In some embodiments, the electronic device 100 includes an output cell 105 and an ESD detector 130. The output cell 105 may generate an output signal for transmission to an external device through a pad 150. The ESD detector 130 may protect the output cell 105 from an ESD. In some embodiments, the electronic device 100 includes more, fewer, or different components than shown in FIG. 1.

The output cell 105 is a circuit or a component that can generate an output signal for transmission to an external device through a pad 150. In some embodiments, the output cell 105 can be an input/output (IO) cell. The IO cell can output a signal at the pad 150 to an external device and receive a signal at the pad 150 from an external device. In some embodiments, the output cell 105 includes a logic circuit 110, protection circuits 160A, 160B, a drive circuit 120, a discharge circuit 140, and a pad 150. These components may operate together to generate and provide a voltage or a current corresponding to an output signal at the pad 150. The output signal may be a digital signal. In some embodiments, the output cell 105 includes more, fewer, or different components than shown in FIG. 1. For example, the discharge circuit 140 may be implemented as part of the ESD detector 130.

In some embodiments, the pad 150 is a conductive structure or a component that can interface with an external device. The pad 150 may be a conductive structure, to which a bonding wire or a conductive pin can be connected. The pad 150 can be an output pad to provide an output signal to an external device. Alternatively, the pad 150 can be an IO pad to provide the output signal to an external device and receive an input signal from the external device.

In some embodiments, the drive circuit 120 is a circuit that can generate an output signal at a node out coupled to the pad 150. In some embodiments, the drive circuit 120 can be replaced by a different circuit or a component that can perform the functionalities of the drive circuit 120 described herein. In some embodiments, the drive circuit 120 includes a first drive circuit 125A and a second drive circuit 125B connected in series. The first drive circuit 125A may include P-type transistors connected in series between a node Out and a first metal rail configured to provide a first supply voltage (e.g., VDDPST or 1.8V). The second drive circuit 125B may include N-type transistors connected in series between the node Out and a second metal rail configured to provide a first reference voltage (e.g., VSS or 0V). In one aspect, the first supply voltage is higher than a supply voltage, for which the transistors of the first drive circuit 125A and the second drive circuit 125B are designed to operate. By implementing the transistors connected in series, a voltage stress or a voltage difference between the first supply voltage and the first reference voltage can be distributed among the transistors of the drive circuit 120. Accordingly, the drive circuit 120 can provide an overdrive capability or generate the output signal having an amplitude larger than a supply voltage, for which the transistors of the drive circuit 120 are designed to operate.

In some embodiments, the logic circuit 110 is a circuit or a component that can generate a logic signal for transmission. In some embodiments, the logic circuit 110 can be replaced by a different circuit or a component that can perform the functionalities of the logic circuit 110 described herein. In one aspect, the logic circuit 110 can generate a first signal 112A and a second signal 112B. The first signal 112A and the second signal 112B may represent or correspond to the same digital data to transmit. In one aspect, the first signal 112A and the second signal 112B may be synchronized with each other but have different voltage levels or voltage ranges. The logic circuit 110 may operate according to multiple power domains to generate the first signal 112A and the second signal 112B having different voltage levels or voltage ranges. For example, the first signal 112A may swing between i) a first voltage level (e.g., VDDPST or 1.8V) and ii) a second voltage level (e.g., VSSH or 0.5V). For example, the second signal 112B may swing between i) a third voltage level (e.g., VDDL or 1.2V) and a fourth voltage level (e.g., VSS or 0V). The logic circuit 110 may provide the first signal 112A to the first drive circuit 125A and the second signal 112B to the second drive circuit 125B.

In some embodiments, the discharge circuit 140 is a circuit or a component that can discharge charges due to an ESD at the pad 150. In some embodiments, the discharge circuit 140 can be replaced by a different circuit or a component that can perform the functionalities of the discharge circuit 140 described herein. The discharge circuit 140 may include a first discharge circuit 145A and a second discharge circuit 145B. The first discharge circuit 145A may include one or more diodes connected in series to the node Out, and the second discharge circuit 145B may include one or more diodes connected in series to the node Out. When a forward bias voltage exceeding a threshold voltage of the discharge circuit 145A or the discharge circuit 145B is applied to the discharge circuit 145A or the discharge circuit 145B due to an ESD, the discharge circuit 145A or the discharge circuit 145B can discharge or conduct current corresponding to the ESD through the pad 150. When a forward bias voltage less than the threshold voltage of a discharge circuit 145 (e.g., discharge circuit 145A or discharge circuit 145B) is applied to the discharge circuit 145, the discharge circuit 145 may operate as capacitors and may not discharge. In addition, when a reverse bias voltage exceeding a breakdown voltage of the discharge circuit 145 (e.g., discharge circuit 145A or discharge circuit 145B) is applied to the discharge circuit 145 due to an ESD, the discharge circuit 145 can discharge or conduct current corresponding to the ESD through the pad 150. When a reverse bias voltage less than the breakdown voltage of the discharge circuit 145 (e.g., discharge circuit 145A or discharge circuit 145B) is applied to the discharge circuit 145, the discharge circuit 145 may operate as capacitors and may not discharge. In some embodiments, the discharge circuit 140 can be implemented as part of the ESD detector 130. Detailed descriptions on implementations and operations of the discharge circuit 140 are provided below with respect to FIGS. 5A-5B.

In some embodiments, the ESD detector 130 is a circuit or a component that can detect the ESD at the pad 150. In some embodiments, the ESD detector 130 can be replaced by a different circuit or a different component that can perform the functionalities of the ESD detector 130 described herein. In one aspect, the ESD detector 130 can detect current through the discharge circuit 140, and generate ESD detection signals 135A, 135B indicating whether the ESD is detected or not. The ESD detection signals 135A, 135B may have opposite logic states. For example, the ESD detection signal 135B having the first supply voltage (e.g., VDDPST or 1.8V) or the second supply voltage (e.g., VDDL or 1.2V) may indicate that an ESD is detected, and the ESD detection signal 135A having the first reference voltage (e.g., VSS or 0V) may indicate that the ESD is detected. For example, the ESD detection signal 135B having the first reference voltage (e.g., VSS or 0V) may indicate that an ESD is not detected, and the ESD detection signal 135A having the first supply voltage (e.g., VDDPST or 1.8V) or the second supply voltage (e.g., VDDL or 1.2V) may indicate that an ESD is not detected. The ESD detector 130 may provide the ESD detection signal 135A to the protection circuit 160A and provide the ESD detection signal 135B to the protection circuit 160B. Detailed descriptions on implementations and operations of the ESD detector 130 are provided below with respect to FIGS. 6A-6D.

In some embodiments, the protection circuits 160A, 160B are circuits or components that can protect the drive circuits 125A, 125B. The protection circuits 160A, 160B may be also referred to as "bias control circuits 160A, 160B" herein. In some embodiments, the protection circuits 160A, 160B can be replaced by different circuits or components that can perform the functionalities of the protection circuits 160A, 160B described herein. In some embodiments, the protection circuits 160A, 160B can receive the ESD detection signals 135A, 135B, and disable the drive circuits 125A, 125B, according to the ESD detection signals 135A, 135B. Disabling a drive circuit 125 may include applying a bias voltage to turn off a transistor of the drive circuit 125, floating (or not applying a voltage to) a gate electrode of a transistor of the drive circuit 125, or a combination of them. For example, in response to the ESD detection signal 135A having the first reference voltage (e.g., VSS or 0V) indicating that an ESD is detected, the protection circuit 160A may disable the drive circuit 125A. For example, in response to the ESD detection signal 135A having the first supply voltage (e.g., VDDPST or 1.8V) or the second supply voltage (e.g., VDDL or 1.2V) indicating that an ESD is not detected, the protection circuit 160A may not disable the drive circuit 125A and allow the drive circuit 125A to generate an output signal at the pad 150, according to the first signal 112A from the logic circuit 110. For example, in response to the ESD detection signal 135B having the first supply voltage (e.g., VDDPST or 1.8V) or the second supply voltage (e.g., VDDL or 1.2V) indicating that an ESD is detected, the protection circuit 160B may disable the drive circuit 125B. For example, in response to the ESD detection signal 135B having the first reference voltage (e.g., VSS or 0V) indicating that an ESD is not detected, the protection circuit 160B may not disable the drive circuit 125B and allow the drive circuit 125B to generate an output signal at the pad 150, according to the second signal 112B from the logic circuit 110. Hence, when an ESD is not detected, the protection circuits 160A, 160B may not disable the drive circuit 120, such that the drive circuit 120 can generate an output signal at the pad 150, according to the first signal 112A and the second signal 112B. When the ESD is detected, the protection circuits 160A, 160B may disable the drive circuit 120, such that the drive circuit 120 can be protected from the ESD. Detailed descriptions on implementations and operations of the protection circuits 160A, 160B and the drive circuit 120 are provided below with respect to FIGS. 7A-7G.

Figure 2:
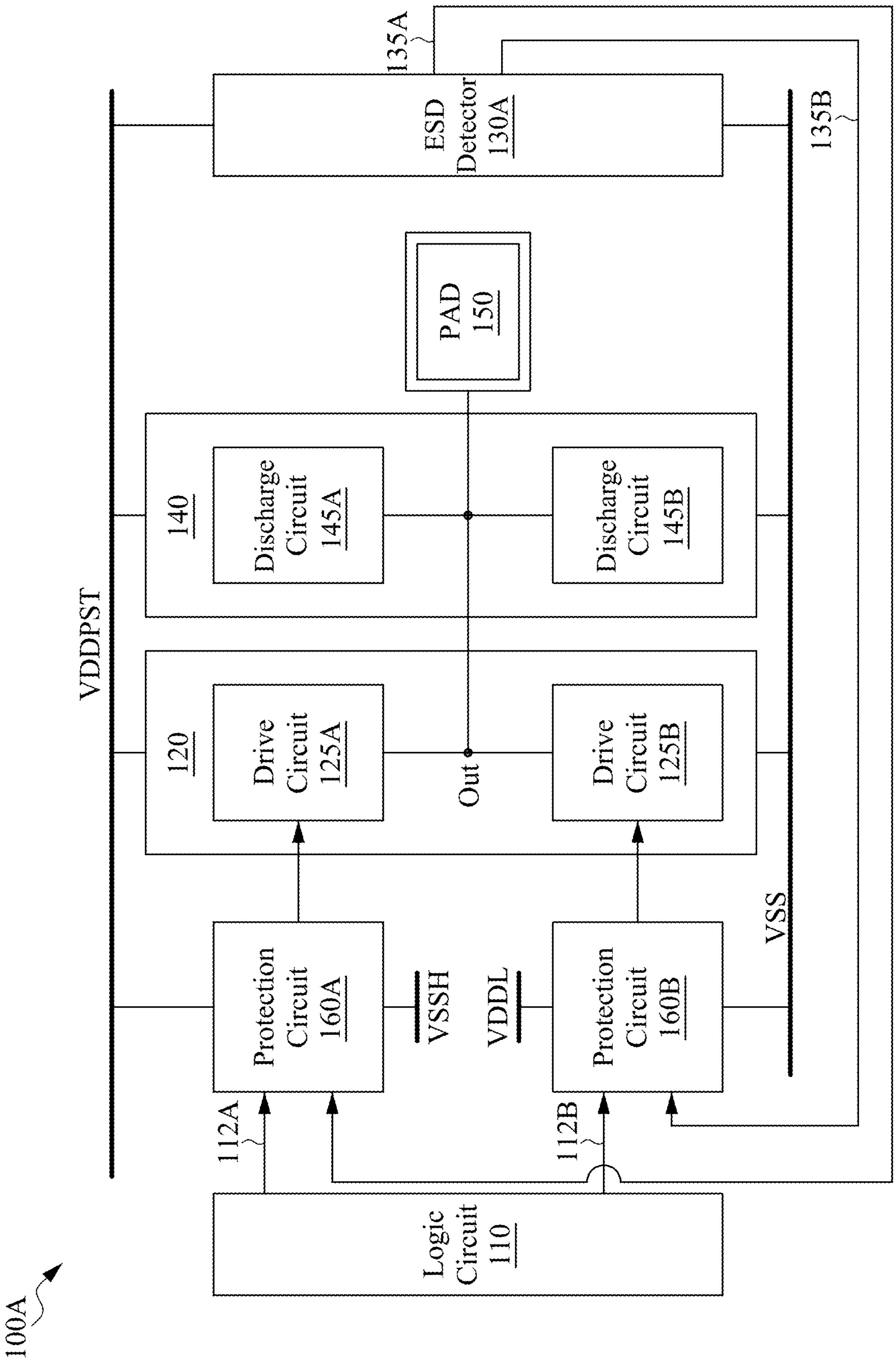
FIG. 2 is a schematic diagram of an electronic device with an ESD protection, in accordance with various embodiments.

FIG. 2 is a schematic diagram of an electronic device 100A with an ESD protection, in accordance with various embodiments. The electronic device 100A may be the electronic device 100 of FIG. 1. In one configuration, the ESD detector 130A, the drive circuit 120, and the discharge circuit 140 operate in a first power domain between a first supply voltage (e.g., VDDPST or 1.8V) and a first reference voltage (e.g., VSS or 0V). In one configuration, the protection circuit 160A operates in a second power domain between the first supply voltage (e.g., VDDPST or 1.8V) and a second reference voltage (e.g., VSSH or 0.5V). In one configuration, the protection circuit 160B operates in a third power domain between a second supply voltage (e.g., VDDL or 1.2V) and the first reference voltage (e.g., VSS or 0V).

In one aspect, the drive circuit 120, the discharge circuit 140, and the ESD detector 130A operate in the same power domain. In some embodiments, the drive circuit 120, the discharge circuit 140, and the ESD detector 130A may be coupled to a first metal rail configured to provide the first supply voltage (e.g., VDDPST or 1.8V) and a second metal rail configured to provide the first reference voltage (e.g., VSS or 0V). The first metal rail may include a single metal rail or one or more metal rails connected through one or via contacts configured to provide the first supply voltage (e.g., VDDPST or 1.8V). The second metal rail may include a single metal rail or one or more metal rails connected through one or via contacts configured to provide the first reference voltage (e.g., VSS or 0V). In this configuration, the discharge circuit 140 may discharge or conduct current through the pad 150, i) in response to a voltage of the pad 150 being higher than a sum of a threshold voltage of the discharge circuit 145A and the first supply voltage (e.g., VDDPST or 1.8V), or ii) in response to a voltage of the pad 150 being lower than a value subtracted from the first reference voltage (e.g., VSS or 0V) by a threshold voltage of the discharge circuit 145B. The ESD detector 130A may detect the ESD according to the discharge by the discharge circuit 140. For example, a voltage of the first metal rail or a voltage of the second metal rail may change, according to the current conducted by the discharge circuit 140. In response to the change in the voltage of the first metal rail or the second metal rail, the ESD detector 130A may detect an ESD at the pad 150, and generate ESD detection signals 135A, 135B indicating that an ESD is detected.

In one aspect, the drive circuit 120 may operate based on the first supply voltage (e.g., VDDPST or 1.8V) higher than a supply voltage (e.g., VDDL or 1.2V) for which transistors of the drive circuit 120 are designed to operate. As described above with respect to FIG. 1, the drive circuit 120 can implement drive circuits 125A, 125B having transistors connected in series, such that a voltage stress or a voltage difference between the first supply voltage (e.g., VDDPST or 1.8V) and the first reference voltage (e.g., VSS or 0V) can be distributed among the transistors. Accordingly, in a normal operating mode (e.g., when an ESD is not detected), the drive circuit 120 can provide an overdrive capability or generate the output signal having an amplitude (e.g., 1.8V) larger than a supply voltage (e.g., 1.2V), for which the transistors of the drive circuit 120 are designed to operate.

In one aspect, the protection circuits 160A, 160B operate in different power domains. In one configuration, the protection circuit 160A is coupled between the first metal rail configured to provide the first supply voltage (e.g., VDDPST or 1.8V) and a third metal rail configured to provide a second reference voltage (e.g., VSSH or 0.5V). The third metal rail may include a single metal rail or one or more metal rails connected through one or via contacts configured to provide the second reference voltage (e.g., VSSH or 0.5V). In one configuration, the protection circuit 160B is coupled between a fourth metal rail configured to provide the second supply voltage (e.g., VDDL or 1.2V) and the second metal rail configured to provide the first reference voltage (e.g., VSS or 0V). The fourth metal rail may include a single metal rail or one or more metal rails connected through one or via contacts configured to provide the second supply voltage (e.g., VDDL or 1.2V). In one aspect, the protection circuits 160A, 160B operating in different power domains may disable the drive circuit 120, when the ESD is detected. For example, the protection circuit 160A may provide or apply the second reference voltage (e.g., VSSH or 0.5V) to disable the drive circuit 125A. For example, the protection circuit 160B may provide or apply the second supply voltage (e.g., VDDL or 1.2V) to disable the drive circuit 125B. By implementing the protection circuits 160A, 160B operating in different power domains, the drive circuit 120 operating in the first power domain between the first supply voltage (e.g., VDDPST or 1.8V) and the first reference voltage (e.g., VSS or 0V) with a large voltage difference can be disabled.

Figure 3:
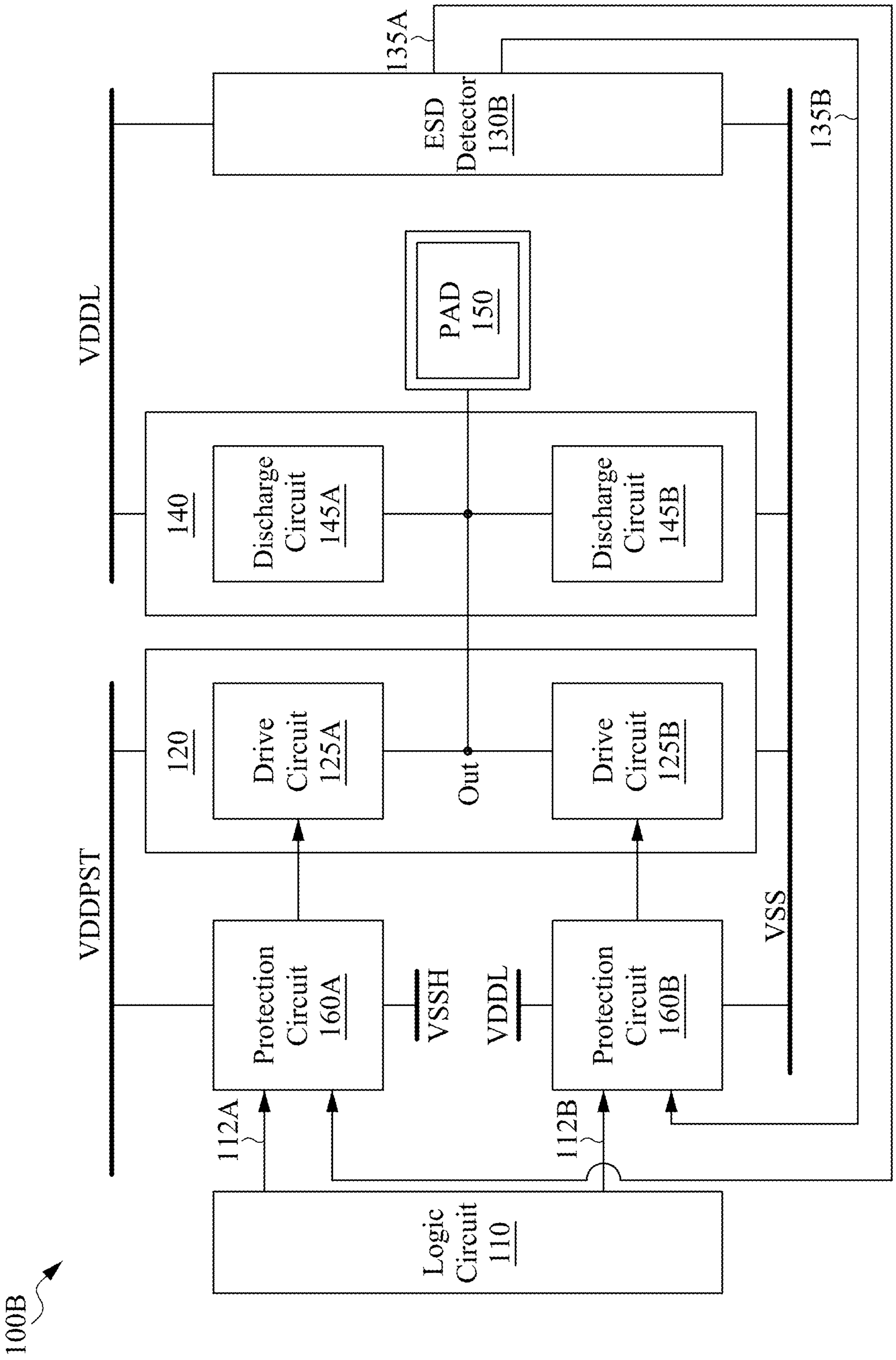
FIG. 3 is a schematic diagram of an electronic device with an ESD protection, in accordance with various embodiments.

FIG. 3 is a schematic diagram of an electronic device 100B with an ESD protection, in accordance with various embodiments. The electronic device 100B is similar to the electronic device 100A of FIG. 2, except that i) the electronic device 100B includes an ESD detector 130B instead of the ESD detector 130A, and ii) the discharge circuit 140 and the ESD detector 130B operate in the third power domain between the second supply voltage (e.g., VDDL or 1.2V) and the first reference voltage (e.g., VSS or 0V). Thus, detailed description of duplicated portion thereof is omitted herein for the sake of brevity.

In one aspect, the discharge circuit 140 and the ESD detector 130B operate in the same power domain. In some embodiments, the discharge circuit 140 and the ESD detector 130B may be coupled to a fifth metal rail configured to provide the second supply voltage (e.g., VDDL or 1.2V) and the second metal rail configured to provide the first reference voltage (e.g., VSS or 0V). The fifth metal rail may include a single metal rail or one or more metal rail connected through one or via contacts providing the second supply voltage (e.g., VDDL or 1.2V). In this configuration, the discharge circuit 140 may discharge or conduct current through the pad 150, i) in response to a voltage of the pad 150 being higher than a sum of a threshold voltage of the discharge circuit 145A and the second supply voltage (e.g., VDDL or 1.2V) or ii) in response to a voltage of the pad 150 being lower than a value subtracted from the first reference voltage (e.g., VSS or 0V) by a threshold voltage of the discharge circuit 145B. The ESD detector 130B may detect the ESD according to the discharge by the discharge circuit 140. For example, a voltage of the fifth metal rail or a voltage of the second metal rail may change, according to the current conducted by the discharge circuit 140. In response to the change in the voltage of the fifth metal rail or the second metal rail, the ESD detector 130B may detect an ESD at the pad 150, and generate ESD detection signals 135A, 135B indicating that the ESD is detected.

In one aspect, the drive circuit 120, the discharge circuit 140 and the ESD detector 130B can operate in different power domains to provide flexibility in configuring or operating the electronic device 100B. For example, the drive circuit 120 operating in the first power domain may be enabled by providing the first supply voltage (e.g., VDDPST or 1.8V) to the first metal rail. While the first supply voltage (e.g., VDDPST or 1.8V) is provided to the first metal rail to enable the drive circuit 120, the discharge circuit 140 and the ESD detector 130B can be selectively enabled by providing the second supply voltage (e.g., VDDL or 1.2V) to the fifth metal rail. Alternatively, while the first supply voltage (e.g., VDDPST or 1.8V) is provided to the first metal rail to enable the drive circuit 120, the discharge circuit 140 and the ESD detector 130B can be selectively disabled by providing the first reference voltage (e.g., VSS or 0V) to the fifth metal rail.

Figure 4:
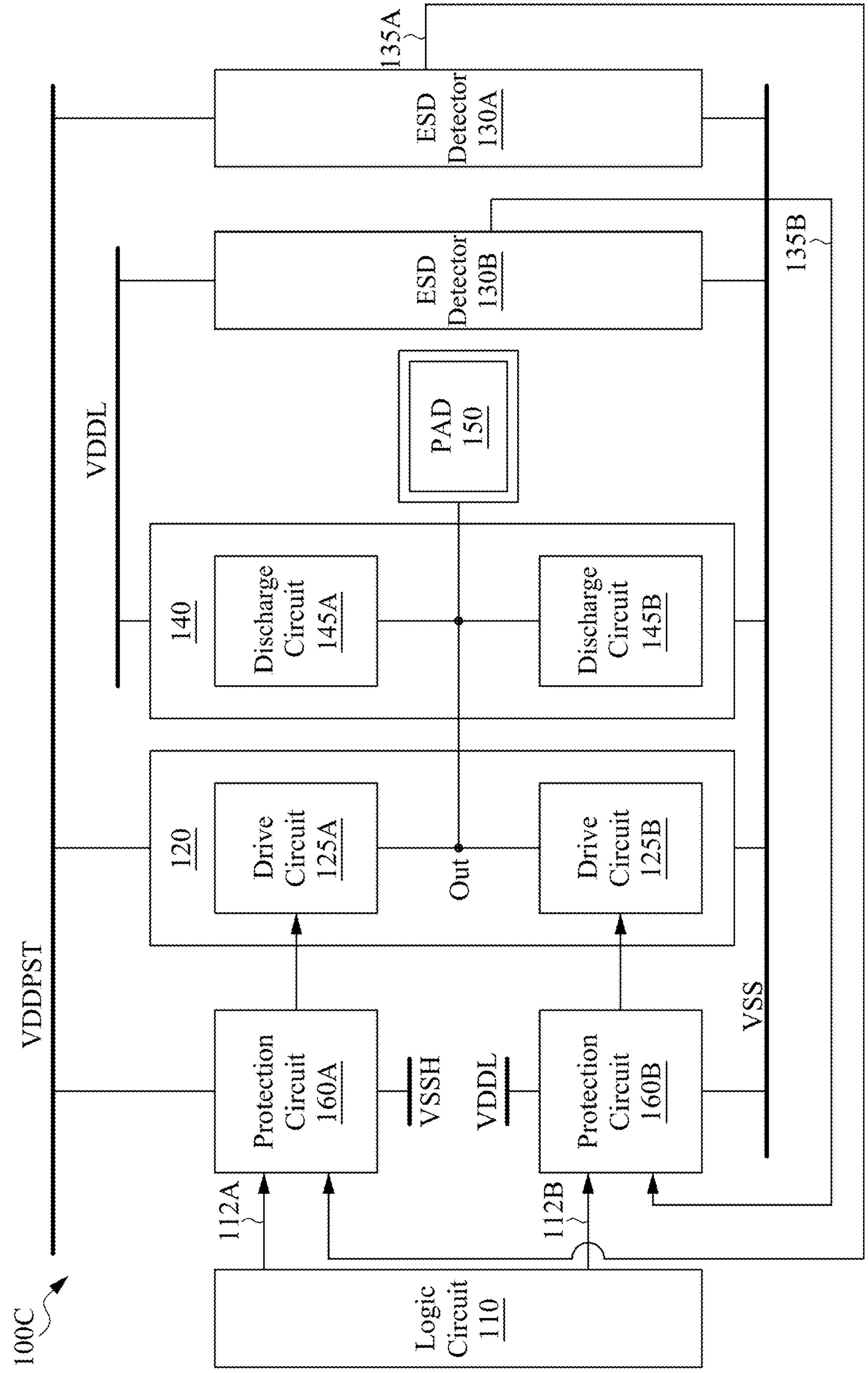
FIG. 4 is a schematic diagram of an electronic device with an ESD protection, in accordance with various embodiments.

FIG. 4 is a schematic diagram of an electronic device 100C with an ESD protection, in accordance with various embodiments. The electronic device 100C is similar to the electronic device 100A of FIG. 2, except the electronic device 100C includes the ESD detector 130A coupled to the drive circuit 120, and the ESD detector 130B coupled to the discharge circuit 140. Thus, detailed description of duplicated thereof is omitted herein for the sake of brevity.

In one configuration, the ESD detector 130A and the drive circuit 120 are coupled between the first metal rail configured to provide the first supply voltage (e.g., VDDPST or 1.8V) and the second metal rail configured to provide the first reference voltage (e.g., VSS or 0V). Hence, the drive circuit 120 and the ESD detector 130A may operate in the first power domain between the first supply voltage (e.g., VDDPST or 1.8V) and the first reference voltage (e.g., VSS or 0V). In one configuration, the ESD detector 130B and the discharge circuit 140 are coupled between the fourth metal rail configured to provide the second supply voltage (e.g., VDDL or 1.2V) and the second metal rail configured to provide the first reference voltage (e.g., VSS or 0V). Hence, the ESD detector 130B and the discharge circuit 140 may operate in the third power domain between the second supply voltage (e.g., VDDL or 1.2V) and the first reference voltage (e.g., VSS or 0V).

In one aspect, the ESD detector 130A may detect an ESD at the pad 150 through the second metal rail. For example, in response to a voltage of the pad 150 being lower than a value subtracted from the first reference voltage (e.g., VSS or 0V) by a threshold voltage of the discharge circuit 145B, the discharge circuit 145B may discharge or conduct current through the pad 150. The ESD detector 130A may detect an ESD according to the discharge by the discharge circuit 145B. For example, a voltage of the second metal rail may change or decrease, according to the current conducted by the discharge circuit 145B. In response to the change in the voltage of the second metal rail, the ESD detector 130A may detect an ESD at the pad 150 and generate the ESD detection signal 135A indicating that the ESD is detected. Hence, the ESD detector 130A can provide the ESD detection signal 135A to cause the protection circuit 160A to protect the drive circuit 125A against an ESD.

In one aspect, the ESD detector 130B may detect an ESD at the pad 150 through the fifth metal rail. For example, in response to a voltage of the pad 150 being higher than a sum of a threshold voltage of the discharge circuit 145A and the second supply voltage (e.g., VDDL or 1.2V), the discharge circuit 145A may discharge or conduct current through the pad 150. The ESD detector 130B may detect an ESD according to the discharge by the discharge circuit 145A. For example, a voltage of the fifth metal rail may change or increase, according to the current conducted by the discharge circuit 145A. In response to the change in the voltage of the fifth metal rail, the ESD detector 130B may detect an ESD at the pad 150 and generate the ESD detection signal 135B indicating that the ESD is detected. Hence, the ESD detector 130B can provide the ESD detection signal 135B to cause the protection circuit 160B to protect the drive circuit 125B against an ESD.

Figure 5A:
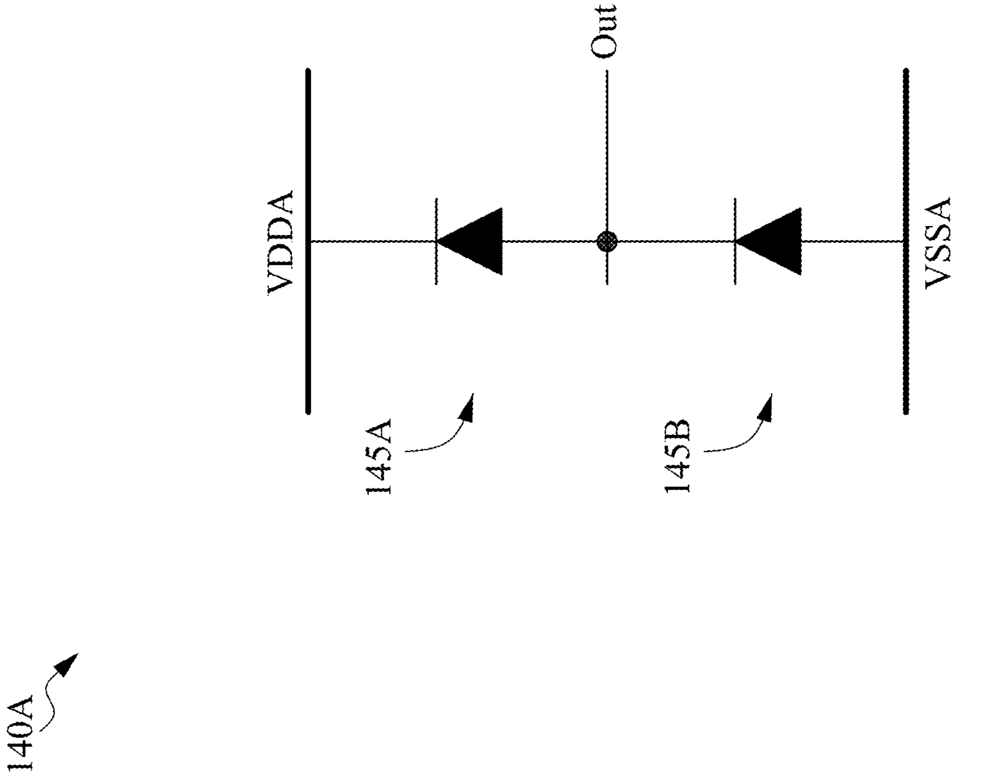
FIGS. 5A and 5B are schematic diagrams of discharge circuits, in accordance with various embodiments.

FIG. 5A is a schematic diagram of a discharge circuit 140A, in accordance with various embodiments. The discharge circuit 140A can be implemented as the discharge circuit 140 in FIGS. 1-4. In some embodiments, the discharge circuit 140A includes the first discharge circuit 145A and the second discharge circuit 145B. The first discharge circuit 145A may include a first diode coupled between i) a metal rail configured to provide a supply voltage VDDA and the node Out coupled to the pad 150. The second discharge circuit 145B may include a diode coupled between i) a metal rail configured to provide a supply voltage VSSA and the node Out coupled to the pad 150. The metal rail configured to provide the supply voltage VDDA may be the first metal rail configured to provide the first supply voltage (e.g., VDDPST or 1.8V) or the fifth metal rail configured to provide the second supply voltage (e.g., VDDL or 1.2V). The metal rail configured to provide the reference voltage VSSA may be the second metal rail configured to provide the first reference voltage (e.g., VSS or 0V). When a voltage higher than a sum of a threshold voltage of the first discharge circuit 145A (or the first diode) and the first supply voltage (e.g., VDDPST or 1.8V) is applied to the pad 150, the first discharge circuit 145A can discharge or conduct current corresponding to the ESD through the pad 150. When a voltage lower than the sum of the threshold voltage of the first discharge circuit 145A and the first supply voltage (e.g., VDDPST or 1.8V) is applied to the pad 150, the first discharge circuit 145A can operate as a capacitor and may not discharge or conduct current through the pad 150. When a voltage lower than a value subtracted from the first reference voltage (e.g., VSS or 0V) by a threshold voltage of the second discharge circuit 145B (or the second diode) is applied to the pad 150, the second discharge circuit 145B can discharge or conduct current corresponding to the ESD through the pad 150. When a voltage higher than the value subtracted from the first reference voltage (e.g., VSS or 0V) by the threshold voltage of the second discharge circuit 145B is applied to the pad 150, the second discharge circuit 145B can operate as a capacitor and may not discharge or conduct current through the pad 150.

Figure 5B:
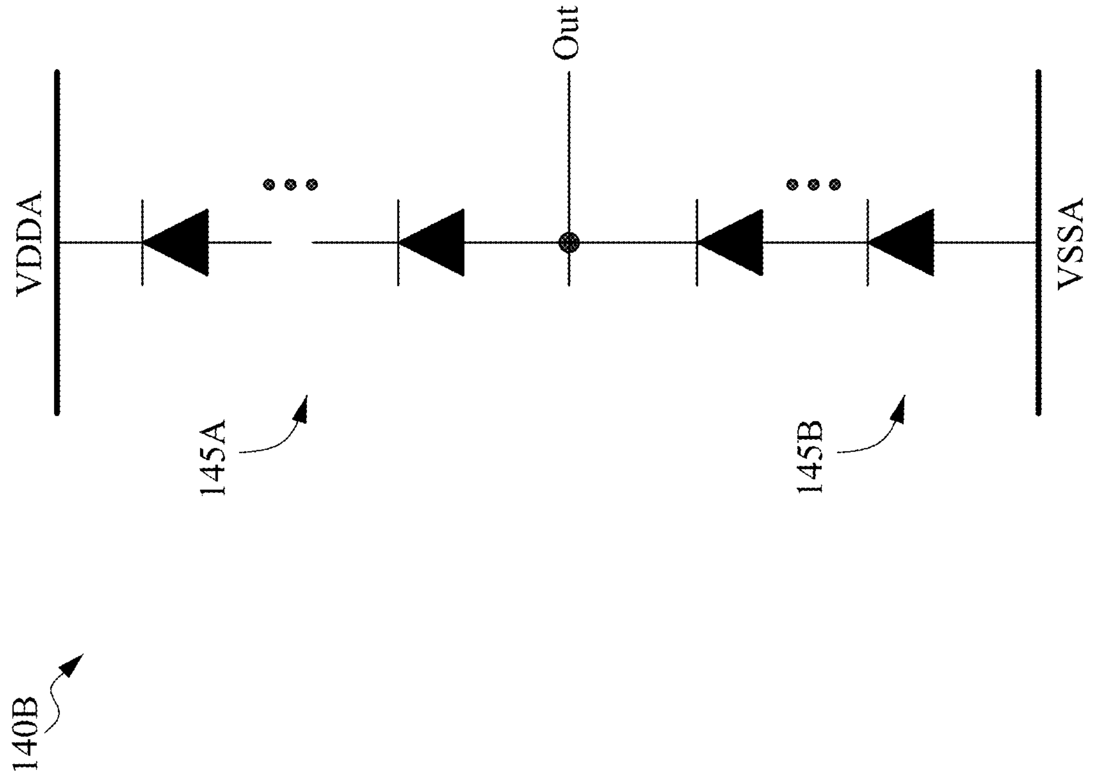

FIG. 5B is a schematic diagram of a discharge circuit 140B, in accordance with various embodiments. The discharge circuit 140B can be implemented as the discharge circuit 140 in FIGS. 1-4. The discharge circuit 140B is similar to the discharge circuit 140A of FIG. 4A, except the discharge circuit 145A includes a first set of diodes and the discharge circuit 145B includes a second set of diodes. The first set of diodes may be coupled in series between i) a metal rail configured to provide a supply voltage VDDA and the node Out coupled to the pad 150. The second set of diodes may be coupled in series between i) a metal rail configured to provide a supply voltage VSSA and the node Out coupled to the pad 150. A threshold voltage of the discharge circuit 145A may correspond to a sum of threshold voltages of the first set of diodes. Similarly, a threshold voltage of the discharge circuit 145B may correspond to a sum of threshold voltages of the second set of diodes. Hence, the number of diodes in the first discharge circuit 145A and the second discharge circuit 145B can be set or determined, according to a target voltage of an ESD, from which to protect the drive circuit 120.

Figure 6A:
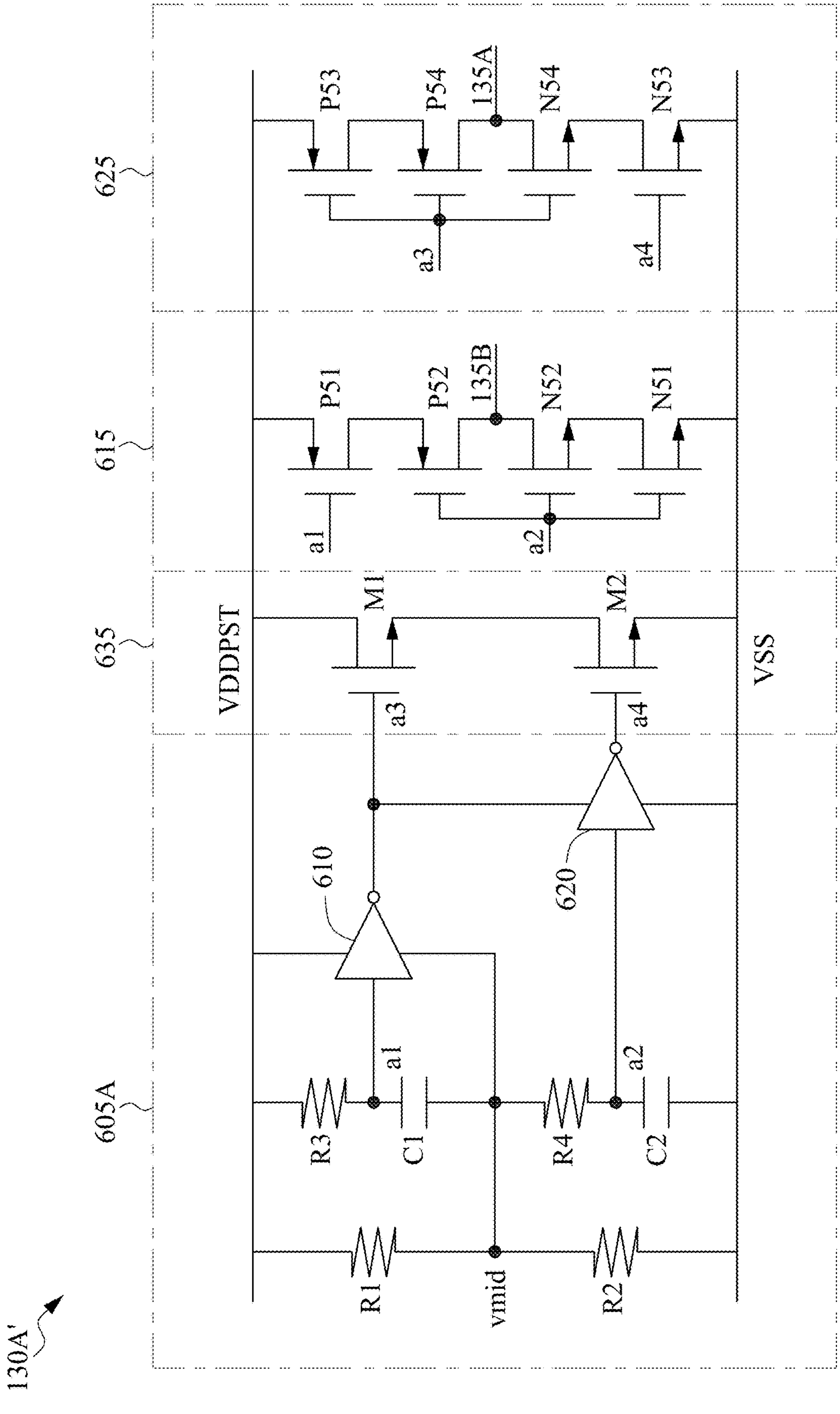
FIGS. 6A through 6D are schematic diagrams of ESD detectors, in accordance with various embodiments.

FIG. 6A is a schematic diagram of an ESD detector 130A', in accordance with various embodiments. In some embodiments, the ESD detector 130A' may be the ESD detector 130A of FIG. 2 or FIG. 4, operating in the first power domain between the first supply voltage (e.g., VDDPST or 1.8V) and the first reference voltage (e.g., VSS or 0V). In some embodiments, the ESD detector 130A' includes a detection circuit 605A, buffer circuits 615, 625, and a power clamp circuit 635. In some embodiments, the ESD detector 130A' includes more, fewer, or different components than shown in FIG. 6A.

In some embodiments, the detection circuit 605A is a circuit that can detect an ESD at the pad 150. In some embodiments, the detection circuit 605A can be replaced by a different circuit or a different component that can perform the functionalities of the detection circuit 605A described herein. In one configuration, the detection circuit 605A includes resistors R1, R2, R3, R4, capacitors C1, C2, and inverters 610, 620. Each of the inverters 610, 620 can be an amplifier or any circuit that can amplify an input signal to generate an output signal with an inverted logic state of the input signal. These components may operate together to detect an ESD at the pad 150. In some embodiments, the detection circuit 605A includes more, fewer, or different components than shown in FIG. 6A.

In one configuration, the resistor R1 is coupled between the first metal rail configured to provide the first supply voltage (e.g., VDDPST or 1.8V) and a node vmid. In one configuration, the resistor R2 is coupled between the node vmid and the second metal rail configured to provide the first reference voltage (e.g., VSS or 0V). The resistors R1, R2 may have the same resistance, such that a voltage of the node vmid may be an average of a voltage of the first metal rail and a voltage of the second metal rail. In one aspect, the resistor R3 is coupled between the first metal rail configured to provide the first supply voltage (e.g., VDDPST or 1.8V) and a node a1. In one aspect, the capacitor C1 is coupled between the node a1 and the node vmid. In one aspect, the resistor R4 is coupled between the node vmid and a node a2. In one aspect, the capacitor C2 is coupled between the node a2 and the second metal rail configured to provide the first reference voltage (e.g., VSS or 0V). In one configuration, the inverter 610 includes i) a first power terminal coupled to the first metal rail configured to provide the first supply voltage (e.g., VDDPST or 1.8V), ii) a second power terminal coupled to the node vmid, iii) an input terminal coupled to the node a1, and iv) an output terminal coupled to a node a3. In one configuration, the inverter 620 includes i) a first power terminal coupled to the node a3, ii) a second power terminal coupled to the second metal rail configured to provide the first reference voltage (e.g., VSS or 0V), iii) an input terminal coupled to the node a2, and iv) an output terminal coupled to a node a4.

In this configuration, the detection circuit 605A can generate voltages at the nodes a1, a2, a3, a4 indicating that an ESD is not detected, in a normal operating mode (e.g., when ESD is not detected). For example, when operating in a normal operating mode, a voltage of the node vmid may be an average (e.g., 0.9V) of the first supply voltage (e.g., VDDPST or 1.8V) and the first reference voltage (e.g., VSS or 0V). When operating in a normal operating mode, a voltage of the node a1 may be or close to the first supply voltage (e.g., VDDPST or 1.8V), because no current may flow through the capacitor C1. When operating in the normal operating mode, a voltage of the node a2 may be or close to the voltage of the node vmid (e.g., 0.9V), because no current may flow through the capacitor C1 or the capacitor C2. When operating in the normal operating mode, a voltage of the node a3 may be or close to the voltage of the node vmid (e.g., 0.9V) corresponding to the logic low of the inverter 610 in the normal operating mode, because the voltage of the input of the inverter 610 is the first supply voltage (e.g., VDDPST or 1.8V) corresponding to logic high of the inverter 610. When operating in the normal operating mode, a voltage of the node a4 may be the first reference voltage (e.g., VSS or 0V) corresponding to the logic low of the inverter 620, because the voltage of the input of the inverter 620 is the node vmid (e.g., 0.9V) corresponding to logic high of the inverter 620 in the normal operating mode.

In one aspect, the detection circuit 605A may detect an ESD at the pad 150, according to a voltage of the first metal rail or a voltage of the second metal rail, and generate voltages at the nodes a1, a2, a3, a4 indicating that the ESD is detected. As described above with respect to FIGS. 1-4, if an ESD occurs, the discharge circuit 140 can discharge or conduct current through the pad 150. According to the discharge due to the ESD, a voltage of the first metal rail or a voltage of the second metal rail may change. For example, if the discharge circuit 145A discharges or conducts current due to a voltage of the pad 150 higher than a sum of the threshold voltage of the discharge circuit 145A and the first supply voltage (e.g., VDDPST or 1.8V), a voltage of the first metal rail may increase from the first supply voltage (e.g., VDDPST or 1.8V). For example, if the discharge circuit 145B discharges or conducts current due to a voltage of the pad 150 lower than a value subtracted from the first reference voltage (e.g., VSS or 0V) by a threshold voltage of the discharge circuit 145B, a voltage of the second metal rail may decrease from the first reference voltage (e.g., VSS or 0V). When a voltage difference between a voltage of the first metal rail and a voltage of the second metal rail suddenly changes to exceed a predetermined value due to an ESD, a voltage of the node a1 may become a voltage of the node vmid and a voltage of the node a2 may become close to the voltage of the second metal rail, because the capacitors C1, C2 may maintain the charges and the voltage difference between the first metal rail and the second metal rail can be shared or distributed between the resistors R3, R4. When the ESD occurs, a voltage of the node a3 may be or close to the voltage of the first metal rail corresponding to logic high of the inverter 610, because the voltage of the input of the inverter 610 is the voltage of the node vmid corresponding to logic low of the inverter 610. When the ESD occurs, a voltage of the node a4 may be or close to the voltage of the first metal rail corresponding to logic high of the inverter 610, because the voltage of the input of the inverter 620 is the voltage of the second metal rail corresponding to logic low of the inverter 620.

In some embodiments, the buffer circuit 615 is a circuit or a component that can amplify voltages at the nodes a1, a2 to generate an ESD signal 135B. In some embodiments, the buffer circuit 615 can be replaced by a different circuit or a different component that can perform the functionalities of the buffer circuit 615 described herein.

In one configuration, the buffer circuit 615 includes transistors P51, P52, N52, N51 connected in series between the first metal rail configured to provide the first supply voltage (e.g., VDDPST or 1.8V) and the second metal rail configured to provide the first reference voltage (e.g., VSS or 0V). The transistors P51, P52 may be embodied as P-type transistors and the transistors N51, N52 may be embodied as N-type transistors. In one configuration, the transistor P51 includes a gate electrode coupled to the node a1, a source electrode coupled to the first metal rail configured to provide the first supply voltage (e.g., VDDPST or 1.8V), and a drain electrode coupled to a source electrode of the transistor P52. In one configuration, the transistor P52 includes a source electrode coupled to the drain electrode of the transistor P51, a gate electrode coupled to the node a2, and a drain electrode coupled to a drain electrode of the transistor N52. In one configuration, the transistor N51 includes a gate electrode coupled to the node a2, a source electrode coupled to the second metal rail configured to provide the first reference voltage (e.g., VSS or 0V), and a drain electrode coupled to a source electrode of the transistor N52. In one configuration, the transistor N52 includes a source electrode coupled to the drain electrode of the transistor N51, a gate electrode coupled to the node a2, and a drain electrode coupled to the drain electrode of the transistor P52. In one aspect, the transistors P51, P52, N52, N51 are connected in series, such that a large voltage difference between the first supply voltage (e.g., VDDPST or 1.8V) and the first reference (e.g., VSS or 0V) can be distributed among the transistors P51, P52, N52, N51.

In this configuration, the buffer circuit 615 may generate the ESD detection signal 135B at the drain electrode of the transistor P52 and the drain electrode of the transistor N52, according to voltages at the nodes a1, a2. For example, in a normal operating mode (e.g., when no ESD is detected), the voltage of the node a1 may be or close to the first supply voltage (e.g., VDDPST or 1.8V), and the voltage of the node a2 may be or close to the voltage of the node vmid (e.g., 0.9V). In response to the first supply voltage (e.g., VDDPST or 1.8V) applied to the gate electrode of the transistor P51, the transistor P51 may be turned off. In response to the voltage of the node vmid (e.g., 0.9V) applied to the gates electrodes of the transistors N51, N52, the transistors N51, N52 may be turned on to set the voltage of the ESD detection signal 135B to the first reference voltage (e.g., VSS or 0V). The ESD detection signal 135B having the first reference voltage (e.g., VSS or 0V) may indicate that an ESD is not detected. For example, when an ESD is detected, the voltage of the node a1 may be or close to a voltage of the node vmid, and the voltage of the node a2 may be a voltage of the second metal rail. In response to the voltage of the second metal rail applied to the gate electrodes of the transistors N51, N52, the transistors N51, N52 may be turned off. In response to the voltage of the node vmid applied to the gate electrode of the transistor P51 and the voltage of the second metal rail applied to the gate electrode of the transistor P52, the transistors P51, P52 may be turned on to set the voltage of the ESD detection signal 135B to a voltage of the first metal rail. The ESD detection signal 135B having the voltage of the first metal rail may indicate that an ESD is detected.

In some embodiments, the buffer circuit 625 is a circuit or a component that can amplify voltages at the nodes a3, a4 to generate an ESD signal 135A. In some embodiments, the buffer circuit 625 can be replaced by a different circuit or a different component that can perform the functionalities of the buffer circuit 625 described herein.

In one configuration, the buffer circuit 625 includes transistors P53, P54, N53, N54 connected in series between the first metal rail configured to provide the first supply voltage (e.g., VDDPST or 1.8V) and the second metal rail configured to provide the first reference voltage (e.g., VSS or 0V). The transistors P53, P54 may be embodied as P-type transistors and the transistors N53, N54 may be embodied as N-type transistors. In one configuration, the transistor P53 includes a gate electrode coupled to the node a3, a source electrode coupled to the first metal rail configured to provide the first supply voltage (e.g., VDDPST or 1.8V) and a drain electrode coupled to a source electrode of the transistor P54. In one configuration, the transistor P54 includes a source electrode coupled to the drain electrode of the transistor P53, a gate electrode coupled to the node a3, and a drain electrode coupled to a drain electrode of the transistor N54. In one configuration, the transistor N53 includes a gate electrode coupled to the node a4, a source electrode coupled to the second metal rail configured to provide the first reference voltage (e.g., VSS or 0V) and a drain electrode coupled to a source electrode of the transistor N54. In one configuration, the transistor N54 includes a source electrode coupled to the drain electrode of the transistor N53, a gate electrode coupled to the node a3, and a drain electrode coupled to the drain electrode of the transistor P54. In one aspect, the transistors P53, P54, N54, N53 are connected in series, such that a large voltage difference between the first supply voltage (e.g., VDDPST or 1.8V) and the first reference (e.g., VSS or 0V) can be distributed among the transistors P53, P54, N54, N53.

In this configuration, the buffer circuit 625 may generate the ESD detection signal 135A at the drain electrode of the transistor P54 and the drain electrode of the transistor N54, according to voltages at the nodes a3, a4. For example, in a normal operating mode (e.g., when no ESD is detected), the voltage of the node a3 may be or close to the voltage of the node vmid (e.g., 0.9V), and the voltage of the node a4 may be or close to the first reference voltage (e.g., VSS or 0V). In response to the first reference voltage (e.g., VSS or 0V) applied to the gate electrode of the transistor N53, the transistor N53 may be turned off. In response to the voltage of the node vmid (e.g., 0.9V) applied to the gate electrodes of the transistors P53, P54, the transistors P53, P54 may be turned on to set the voltage of the ESD detection signal 135A to the first supply voltage (e.g., VDDPST or 1.8V). The ESD detection signal 135A having the first supply voltage (e.g., VDDPST or 1.8V) may indicate that an ESD is not detected. For example, when an ESD is detected, the voltages at the nodes a3, a4 may be or close to a voltage of the first metal rail. In response to the voltage of the first metal rail applied to the gate electrodes of the transistors P53, P54, the transistors P53, P54 may be turned off. In response to the voltage of the first metal rail applied to the gate electrodes of the transistors N53, N54, the transistors N53, N54 may be turned on to set the voltage of the ESD detection signal 135A to the voltage of the second metal rail. The ESD detection signal 135A having the voltage of the second metal rail may indicate that an ESD is detected.

In some embodiments, the power clamp circuit 635 is a circuit or a component that can keep or maintain a voltage difference between the first metal rail and the second metal rail. In some embodiments, the power clamp circuit 635 can be replaced by a different circuit that can perform the functionalities of the power clamp circuit 635 disclosed herein. In one configuration, the power clamp circuit 635 includes transistors M1, M2 connected in series between the first metal rail configured to provide the first supply voltage (e.g., VDDPST or 1.8V) and the second metal rail configured to provide the first reference voltage (e.g., VSS or 0V). In one configuration, the transistor M1 is embodied as an N-type transistor including i) a gate electrode coupled to the node a3, ii) a drain electrode coupled to the first metal rail configured to provide the first supply voltage (e.g., VDDPST or 1.8V), and iii) a source electrode coupled to a drain electrode of the transistor M2. In one configuration, the transistor M2 is embodied as an N-type transistor including i) a gate electrode coupled to the node a4, ii) the drain electrode coupled to the source electrode of the transistor M1, and iii) a source electrode coupled to the second metal rail configured to provide the first reference voltage (e.g., VSS or 0V). In this configuration, in the normal operating mode, the transistor M2 may be turned off such that current may not flow through the transistors M1, M2, because the voltage of the node a4 in the normal operating mode is the first reference voltage (e.g., VSS or 0V). In case an ESD occurs, in response to the voltages at the nodes a3, a4 being or close to the voltage of the first metal rail, the transistors M1, M2 can be turned on to allow current to flow from the first metal rail to the second metal rail to reduce a voltage difference between the voltage of the first metal rail and the voltage of the second metal rail.

Figure 6B:
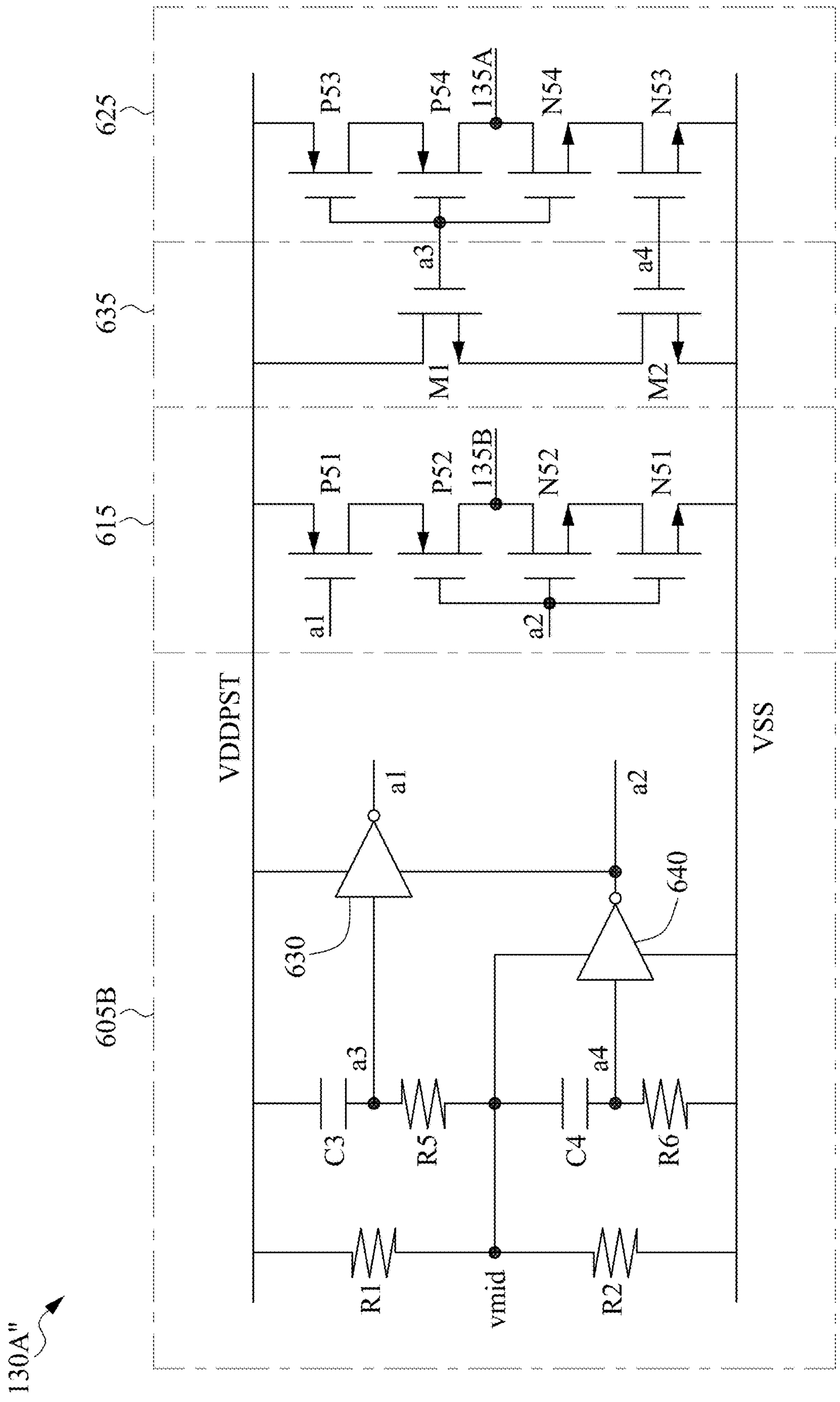

FIG. 6B is a schematic diagram of an ESD detector 130A", in accordance with various embodiments. In some embodiments, the ESD detector 130A" may be the ESD detector 130A of FIG. 2 or FIG. 4, operating in the first power domain between the first supply voltage (e.g., VDDPST or 1.8V) and the first reference voltage (e.g., VSS or 0V). In one aspect, the ESD detector 130A" is similar to the ESD detector 130A' of FIG. 6A, except the ESD detector 130A" includes a detection circuit 605B instead of the detection circuit 605A. Thus, detailed description of duplicated portion thereof is omitted herein for the sake of brevity.

In some embodiments, the detection circuit 605B is a circuit that can detect an ESD at the pad 150. In some embodiments, the detection circuit 605B can be replaced by a different circuit or a different component that can perform the functionalities of the detection circuit 605B described herein. In one configuration, the detection circuit 605B includes resistors R1, R2, R5, R6, capacitors C3, C4, and inverters 630, 640. Each of the inverters 630, 640 can be an amplifier or any circuit that can amplify an input signal to generate an output signal with an inverted logic state of the input signal. These components may operate together to detect an ESD at the pad 150. In some embodiments, the detection circuit 605B includes more, fewer, or different components than shown in FIG. 6B.

In one configuration, the resistor R1 is coupled between the first metal rail configured to provide the first supply voltage (e.g., VDDPST or 1.8V) and a node vmid. In one configuration, the resistor R2 is coupled between the node vmid and the second metal rail configured to provide the first reference voltage (e.g., VSS or 0V). The resistors R1, R2 may have the same resistance, such that a voltage of the node vmid may be an average of a voltage of the first metal rail and a voltage of the second metal rail. In one aspect, the capacitor C3 is coupled between the first metal rail configured to provide the first supply voltage (e.g., VDDPST or 1.8V) and a node a3. In one aspect, the resistor R5 is coupled between the node a3 and the node vmid. In one aspect, the capacitor C4 is coupled between the node vmid and a node a4. In one aspect, the resistor R6 is coupled between the node a4 and the second metal rail configured to provide the first reference voltage (e.g., VSS or 0V). In one configuration, the inverter 640 includes i) a first power terminal coupled to the node vmid, ii) a second power terminal coupled to the second metal rail configured to provide the first reference voltage (e.g., VSS or 0V), iii) an input terminal coupled to the node a4, and iv) an output terminal coupled to a node a2. In one configuration, the inverter 630 includes i) a first power terminal coupled to the first metal rail configured to provide the first supply voltage (e.g., VDDPST or 1.8V), ii) a second power terminal coupled to the node a2, iii) an input terminal coupled to the node a3, and iv) an output terminal coupled to a node a1.

In this configuration, the detection circuit 605B can generate voltages at the nodes a1, a2, a3, a4 indicating that an ESD is not detected, in a normal operating mode (e.g., when ESD is not detected). For example, when operating in a normal operating mode, a voltage of the node vmid may be an average (e.g., 0.9V) of the first supply voltage (e.g., VDDPST or 1.8V) and the first reference voltage (e.g., VSS or 0V). When operating in a normal operating mode, a voltage of the node a3 may be or close to a voltage (e.g., 0.9V) of the node vmid, because no current may flow through the capacitors C3, C4. When operating in the normal operating mode, a voltage of the node a4 may be or close to the first reference voltage (e.g., VSS or 0V), because no current may flow through the capacitor C4. When operating in the normal operating mode, a voltage of the node a2 may be or close to the voltage of the node vmid (e.g., 0.9V) corresponding to the logic high of the inverter 640 in the normal operating mode, because the voltage of the input of the inverter 640 is the first reference voltage (e.g., VSS or 0V) corresponding to logic low of the inverter 640. When operating in the normal operating mode, a voltage of the node a1 may be the first supply voltage (e.g., VDDPST or 1.8V) corresponding to the logic high of the inverter 630 in the normal operating mode, because the voltage of the input of the inverter 630 is the node vmid (e.g., 0.9V) corresponding to logic low of the inverter 630 in the normal operating mode.

In one aspect, the detection circuit 605B may detect an ESD at the pad 150, according to a voltage of the first metal rail or a voltage of the second metal rail, and generate voltages at the nodes a1, a2, a3, a4 indicating that the ESD is detected. As described above with respect to FIGS. 1-4, if an ESD occurs, the discharge circuit 140 can discharge or conduct current through the pad 150. According to the discharge due to the ESD, a voltage of the first metal rail or a voltage of the second metal rail may change. For example, if the discharge circuit 145A discharges or conducts current due to a voltage of the pad 150 higher than a sum of the threshold voltage of the discharge circuit 145A and the first supply voltage (e.g., VDDPST or 1.8V), a voltage of the first metal rail may increase from the first supply voltage (e.g., VDDPST or 1.8V). For example, if the discharge circuit 145B discharges or conducts current due to a voltage of the pad 150 lower than a value subtracted from the first reference voltage (e.g., VSS or 0V) by a threshold voltage of the discharge circuit 145B, a voltage of the second metal rail may decrease from the first reference voltage (e.g., VSS or 0V). When a voltage difference between a voltage of the first metal rail and a voltage of the second metal rail suddenly changes to exceed a predetermined value due to an ESD, a voltage of the node a3 may become a voltage of the first metal rail and a voltage of the node a4 may become close to the voltage of the node vmid, because the capacitors C3, C4 may maintain the charges and the voltage difference between the first metal rail and the second metal rail can be shared or distributed between the resistors R5, R6. When the ESD occurs, a voltage of the node a2 may be or close to the voltage of the second metal rail corresponding to logic low of the inverter 640, because the voltage of the input of the inverter 640 is the voltage of the node vmid corresponding to logic high of the inverter 640. When the ESD occurs, a voltage of the node a1 may be or close to the voltage of the second metal rail corresponding to logic low of the inverter 630, because the voltage of the input of the inverter 630 is the voltage of the first metal rail corresponding to logic high of the inverter 630.

Figure 6C:
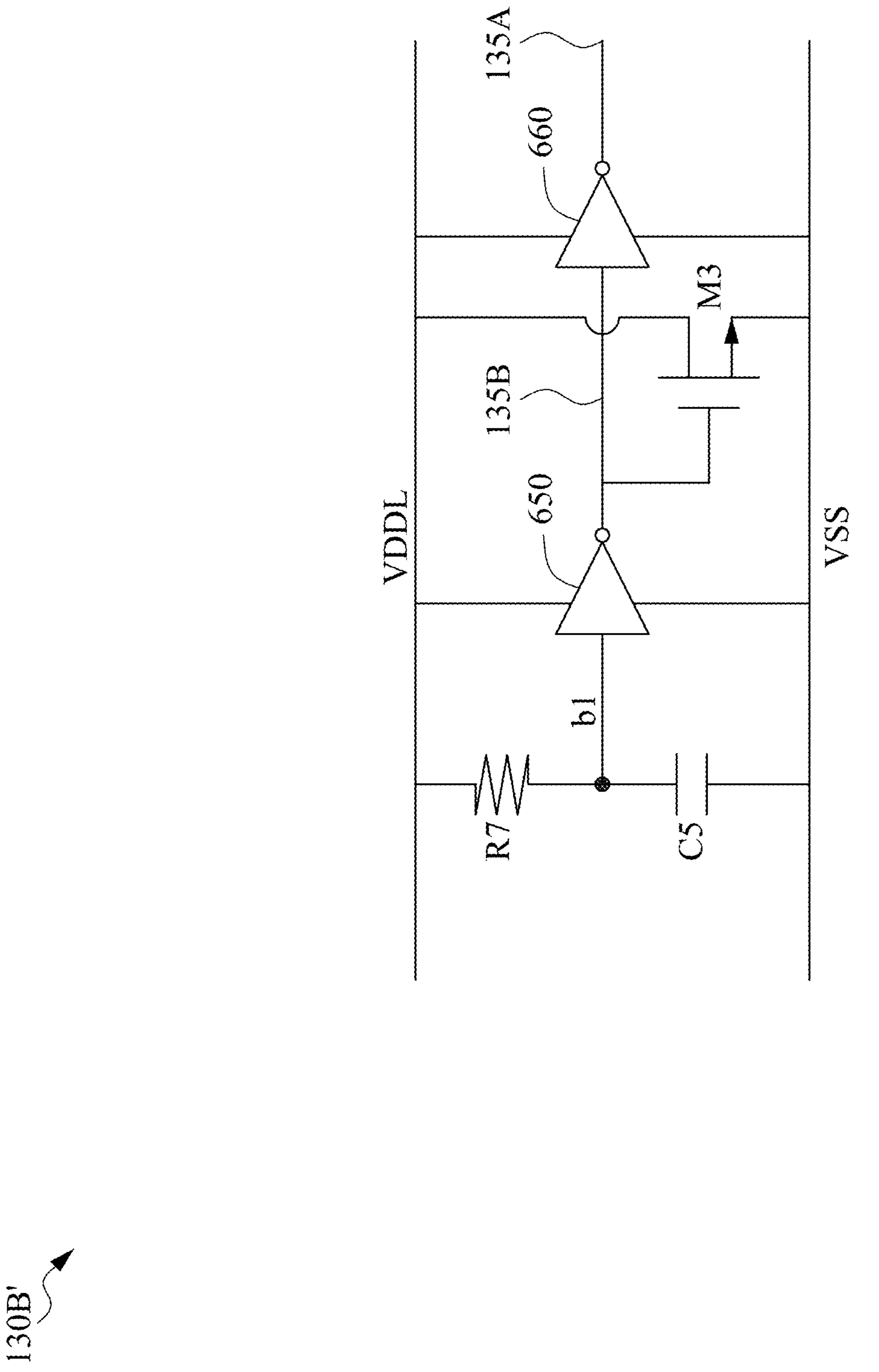

FIG. 6C is a schematic diagram of an ESD detector 130B', in accordance with various embodiments. In some embodiments, the ESD detector 130B' may be the ESD detector 130B of FIG. 3 or FIG. 4, operating in the third power domain between the second supply voltage (e.g., VDDL or 1.2V) and the first reference voltage (e.g., VSS or 0V). In some embodiments, the ESD detector 130B' includes a resistor R7, a capacitor C5, an inverter 650, an inverter 660, and a transistor M3. In some embodiments, the ESD detector 130B' includes more, fewer, or different components than shown in FIG. 6C.

In one configuration, the resistor R7 is coupled between the fifth metal rail configured to provide the second supply voltage (e.g., VDDL or 1.2V) and a node b1. In one configuration, the capacitor C5 is coupled between the node b1 and the second metal rail configured to provide the first reference voltage (e.g., VSS or 0V). In one configuration, the inverter 650 includes a first power terminal coupled to the fifth metal rail configured to provide the second supply voltage (e.g., VDDL or 1.2V), a second power terminal coupled to the second metal rail configured to provide the first reference voltage (e.g., VSS or 0V), an input terminal coupled to the node b1, and an output terminal to provide an ESD detection signal 135B. In one configuration, the inverter 660 includes a first power terminal coupled to the fifth metal rail configured to provide the second supply voltage (e.g., VDDL or 1.2V), a second power terminal coupled to the second metal rail configured to provide the first reference voltage (e.g., VSS or 0V), an input terminal coupled to an output terminal of the inverter 650, and an output terminal to provide an ESD detection signal 135A. In one implementation, the transistor M3 is embodied as an N-type transistor. The transistor M3 may include a gate electrode to receive the ESD detection signal 135B, a drain electrode coupled to the fifth metal rail configured to provide the second supply voltage (e.g., VDDL or 1.2V), and a source electrode coupled to the second metal rail configured to provide the first reference voltage (e.g., VSS or 0V).

In this configuration, the ESD detector 130B' can generate the ESD detection signals 135A, 135B indicating that an ESD is not detected, in a normal operating mode (e.g., when ESD is not detected). For example, when operating in a normal operating mode, a voltage of the node b1 may be the second supply voltage (e.g., VDDL or 1.2V), because no current may flow through the capacitor C5. When operating in the normal operating mode, a voltage of the ESD detection signal 135B may be or close to the first reference voltage (e.g., VSS or 0V) corresponding to the logic low of the inverter 650 in the normal operating mode, because the voltage of the input of the inverter 650 is the second supply voltage (e.g., VDDL or 1.2V) corresponding to logic high of the inverter 650. When operating in the normal operating mode, a voltage of the ESD detection signal 135A may be the second supply voltage (e.g., VDDL or 1.2V) corresponding to the logic high of the inverter 660 in the normal operating mode, because the voltage of the input of the inverter 660 is the first reference voltage (e.g., VSS or 0V) corresponding to logic low of the inverter 660 in the normal operating mode.

In one aspect, the ESD detector 130B' may detect an ESD at the pad 150, according to a voltage of the fifth metal rail or a voltage of the second metal rail, and generate the ESD detection signals 135A, 135B indicating that the ESD is detected. As described above with respect to FIGS. 1-4, if an ESD occurs, the discharge circuit 140 can discharge or conduct current through the pad 150. According to the discharge due to the ESD, a voltage of the fifth metal rail or a voltage of the second metal rail may change. For example, if the discharge circuit 145A discharges or conducts current due to a voltage of the pad 150 higher than a sum of the threshold voltage of the discharge circuit 145A and the second supply voltage (e.g., VDDL or 1.2V), a voltage of the fifth metal rail may increase from the second supply voltage (e.g., VDDL or 1.2V). For example, if the discharge circuit 145B discharges or conducts current due to a voltage of the pad 150 lower than a value subtracted from the first reference voltage (e.g., VSS or 0V) by a threshold voltage of the discharge circuit 145B, a voltage of the second metal rail may decrease from the first reference voltage (e.g., VSS or 0V). When a voltage difference between a voltage of the fifth metal rail and a voltage of the second metal rail suddenly changes to exceed a predetermined value due to an ESD, a voltage of the node b1 may become a voltage of the second metal rail, because the capacitor C5 may maintain the charges. When the ESD occurs, a voltage of the ESD detection signal 135B may be or close to the voltage of the fifth metal rail corresponding to logic high of the inverter 650, because the voltage of the input of the inverter 650 is the voltage of the second metal rail corresponding to logic low of the inverter 650. When the ESD occurs, a voltage of the ESD detection signal 135A may be or close to the voltage of the second metal rail corresponding to logic low of the inverter 660, because the voltage of the input of the inverter 660 is the voltage of the fifth metal rail corresponding to logic high of the inverter 660.

In some embodiments, the transistor M3 operates as a power clamp circuit to keep or maintain a voltage difference between the fifth metal rail and the second metal rail. In some embodiments, the transistor M3 can be replaced by a different circuit that can perform the functionalities of the transistor M3 or a power clamp circuit. In one configuration, the transistor M3 is embodied as an N-type transistor including i) a gate electrode coupled to an output of the inverter 650, ii) a drain electrode coupled to the fifth metal rail configured to provide the second supply voltage (e.g., VDDL or 1.2V), and iii) a source electrode coupled to the second metal rail configured to provide the first reference voltage (e.g., VSS or 0V). In this configuration, in the normal operating mode, the transistor M3 may be turned off such that current may not flow through the transistor M3, because the voltage of the ESD detection signal 135B in the normal operating mode is the first reference voltage (e.g., VSS or 0V). In case an ESD occurs, in response to the ESD detection signal 135B being or close to the voltage of the fifth metal rail, the transistor M3 can be turned on to allow current to flow from the fifth metal rail to the second metal rail to reduce a voltage difference between the voltage of the fifth metal rail and the voltage of the second metal rail.

Figure 6D:
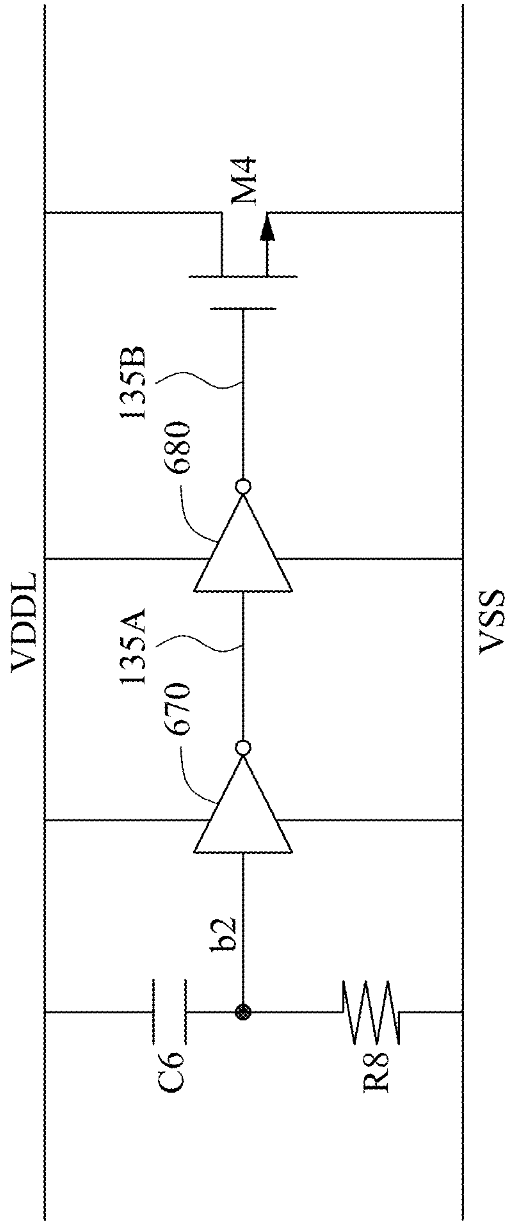

FIG. 6D is a schematic diagram of an ESD detector 130B", in accordance with various embodiments. In some embodiments, the ESD detector 130B" may be the ESD detector 130B of FIG. 3 or FIG. 4, operating in the third power domain between the second supply voltage (e.g., VDDL or 1.2V) and the first reference voltage (e.g., VSS or 0V). In some embodiments, the ESD detector 130B" includes a resistor R8, a capacitor C6, an inverter 670, an inverter 680, and a transistor M4. In one aspect, the transistor M4 operates in a similar manner as the transistor M3 or a power clamp circuit. Thus, detailed description on duplicated portion thereof is omitted herein for the sake of brevity. In some embodiments, the ESD detector 130B" includes more, fewer, or different components than shown in FIG. 6D.

In one configuration, the capacitor C6 is coupled between the fifth metal rail configured to provide the second supply voltage (e.g., VDDL or 1.2V) and a node b2. In one configuration, the resistor R8 is coupled between the node b2 and the second metal rail configured to provide the first reference voltage (e.g., VSS or 0V). In one configuration, the inverter 670 includes a first power terminal coupled to the fifth metal rail configured to provide the second supply voltage (e.g., VDDL or 1.2V), a second power terminal coupled to the second metal rail configured to provide the first reference voltage (e.g., VSS or 0V), an input terminal coupled to the node b2, and an output terminal to provide an ESD detection signal 135A. In one configuration, the inverter 680 includes a first power terminal coupled to the fifth metal rail configured to provide the second supply voltage (e.g., VDDL or 1.2V), a second power terminal coupled to the second metal rail configured to provide the first reference voltage (e.g., VSS or 0V), an input terminal coupled to an output terminal of the inverter 670, and an output terminal to provide an ESD detection signal 135B. In one implementation, the transistor M4 is embodied as an N-type transistor. The transistor M4 may include a gate electrode to receive the ESD detection signal 135B, a drain electrode coupled to the fifth metal rail configured to provide the second supply voltage (e.g., VDDL or 1.2V), and a source electrode coupled to the second metal rail configured to provide the first reference voltage (e.g., VSS or 0V).

In this configuration, the ESD detector 130B" can generate the ESD detection signals 135A, 135B indicating that an ESD is not detected, in a normal operating mode (e.g., when ESD is not detected). For example, when operating in a normal operating mode, a voltage of the node b2 may be the first reference voltage (e.g., VSS or 0V), because no current may flow through the capacitor C6. When operating in the normal operating mode, a voltage of the ESD detection signal 135A may be or close to the second supply voltage (e.g., VDDL or 1.2V) corresponding to the logic high of the inverter 670 in the normal operating mode, because the voltage of the input of the inverter 670 is the first reference voltage (e.g., VSS or 0V) corresponding to logic low of the inverter 670. When operating in the normal operating mode, a voltage of the ESD detection signal 135B may be the first reference voltage (e.g., VSS or 0V) corresponding to the logic low of the inverter 680 in the normal operating mode, because the voltage of the input of the inverter 680 is the second supply voltage (e.g., VDDL or 1.2V) corresponding to logic high of the inverter 680 in the normal operating mode.

In one aspect, the ESD detector 130B" may detect an ESD at the pad 150, according to a voltage of the fifth metal rail or a voltage of the second metal rail, and generate the ESD detection signals 135A, 135B indicating that the ESD is detected. As described above with respect to FIGS. 1-4, if an ESD occurs, the discharge circuit 140 can discharge or conduct current through the pad 150. According to the discharge due to the ESD, a voltage of the fifth metal rail or a voltage of the second metal rail may change. For example, if the discharge circuit 145A discharges or conducts current due to a voltage of the pad 150 higher than a sum of the threshold voltage of the discharge circuit 145A and the second supply voltage (e.g., VDDL or 1.2V), a voltage of the fifth metal rail may increase from the second supply voltage (e.g., VDDL or 1.2V). For example, if the discharge circuit 145B discharges or conducts current due to a voltage of the pad 150 lower than a value subtracted from the first reference voltage (e.g., VSS or 0V) by a threshold voltage of the discharge circuit 145B, a voltage of the second metal rail may decrease from the first reference voltage (e.g., VSS or 0V). When a voltage difference between a voltage of the fifth metal rail and a voltage of the second metal rail suddenly changes to exceed a predetermined value due to an ESD, a voltage of the node b2 may become a voltage of the fifth metal rail, because the capacitor C6 may maintain the charges. When the ESD occurs, a voltage of the ESD detection signal 135A may be or close to the voltage of the second metal rail corresponding to logic low of the inverter 670, because the voltage of the input of the inverter 670 is the voltage of the fifth metal rail corresponding to logic high of the inverter 670. When the ESD occurs, a voltage of the ESD detection signal 135B may be or close to the voltage of the fifth metal rail corresponding to logic high of the inverter 680, because the voltage of the input of the inverter 680 is the voltage of the second metal rail corresponding to logic low of the inverter 680.

Figure 7A:
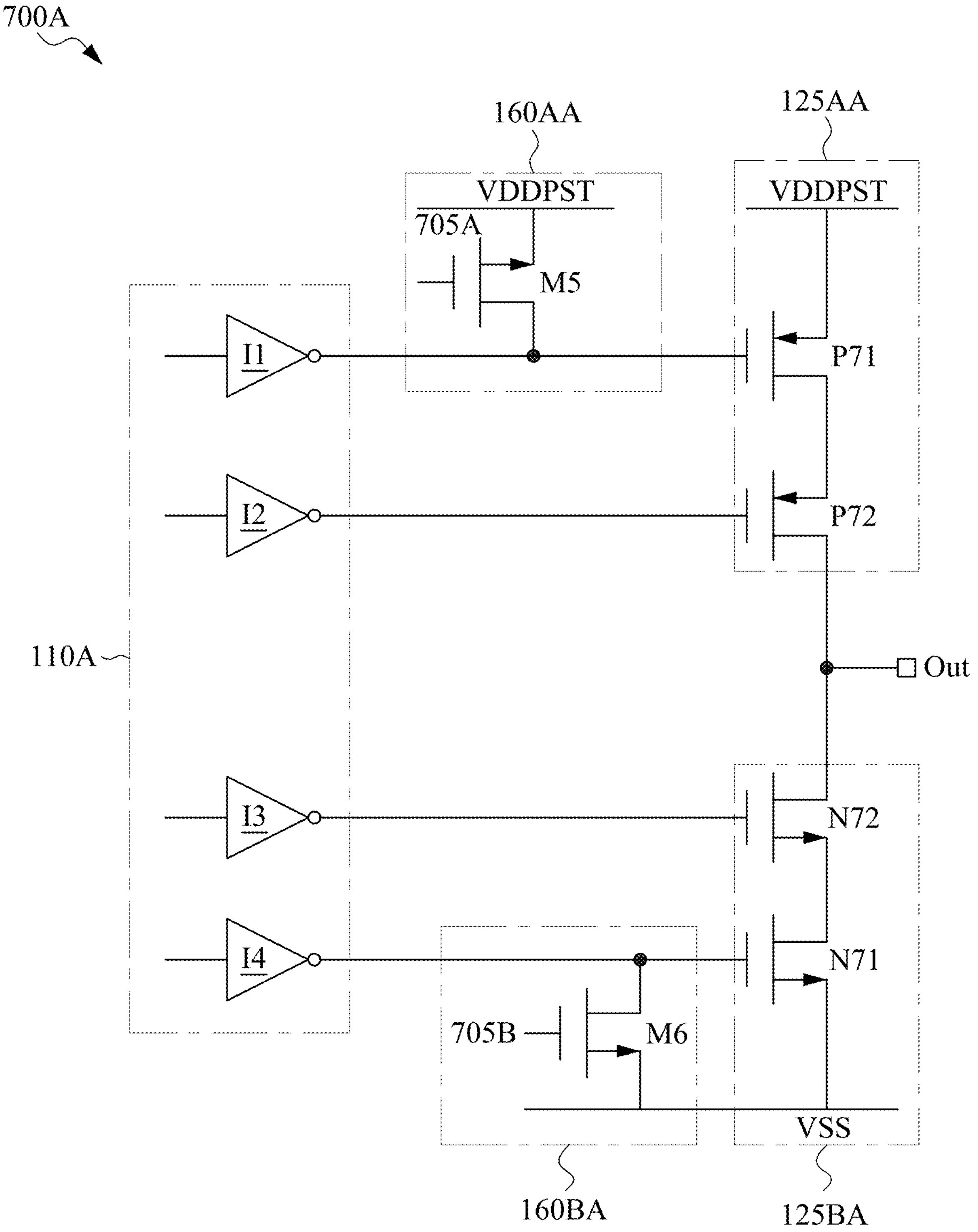
FIGS. 7A through 7G are schematic diagrams of logic circuits, drive circuits, and ESD protection circuits, in accordance with various embodiments.

FIG. 7A is a schematic diagram of a portion 700A of an electronic device 100 including a logic circuit 110A, drive circuits 125AA, 125BA, and protection circuits 160AA, 160BA, in accordance with various embodiments. In some embodiments, the logic circuit 110A may be the logic circuit 110 of FIGS. 1-4. In some embodiments, the drive circuits 125AA, 125BA may be the drive circuits 125A, 125B of FIGS. 1-4, respectively. In some embodiments, the protection circuits 160AA, 160AB may be the protection circuits 160A, 160B of FIGS. 1-4, respectively. Thus, detailed description of duplicated portion thereof is omitted herein for the sake of brevity.

In some embodiments, the logic circuit 110A include logic circuits I1, I2, I3, I4. In one aspect, the logic circuit 110A operates based on two power domains: a second power domain between the first supply voltage (e.g., VDDPST or 1.8V) and the second reference voltage (e.g., VSSH or 0.5V), and a third power domain between the second supply voltage (e.g., VDDL or 1.2V) and the first reference voltage (e.g., VSS or 0V). For example, logic circuits I1 and I2 may operate based on the second power domain to generate signals swinging between the first supply voltage (e.g., VDDPST or 1.8V) and the second reference voltage (e.g., VSSH or 0.5V). For example, logic circuits I3 and I4 may operate based on the third power domain to generate signals swinging between the second supply voltage (e.g., VDDL or 1.2V) and the first reference voltage (e.g., VSS or 0V). The signals output by the logic circuits I1-I4 may be synchronized with each other and represent a data to transmit.

In some embodiments, the drive circuit 125AA can pull up a voltage at the node Out according to voltages or signals from the logic circuits I1, I2 to generate an output signal to provide through the pad 150. In some embodiments, the drive circuit 125AA can be replaced by a different circuit or a component that can perform the functionalities of the drive circuit 125AA described herein. In some embodiments, the drive circuit 125AA includes P-type transistors P71, P72 connected in series between the first metal rail configured to provide the first supply voltage (e.g., VDDPST or 1.8V) and the node Out connected to the pad 150. In one configuration, the transistor P71 includes a source electrode coupled to the first metal rail configured to provide the first supply voltage (e.g., VDDPST or 1.8V), a gate electrode coupled to an output of the logic circuit I1, and a drain electrode coupled to a source electrode of the transistor P72. In one configuration, the transistor P72 includes a source electrode coupled to the drain electrode of the transistor P71, a gate electrode coupled to an output of the logic circuit I2, and a drain electrode coupled to the node Out. In this configuration, when the first supply voltage (e.g., VDDPST or 1.8V) is applied to the gate electrodes of the transistors P71, P72, the transistors P71, P72 may be disabled to not conduct current through the transistors P71, P72. When the second reference voltage (e.g., VSSH or 0.5V) is applied to the gate electrodes of the transistors P71, P72, the transistors P71, P72 may be enabled to conduct current through the transistors P71, P72, to set the voltage of the node Out to be the first supply voltage (e.g., VDDPST or 1.8V).

In some embodiments, the drive circuit 125BA can pull down a voltage at the node Out according to voltages or signals from the logic circuits I3, I4 to generate an output signal to provide through the pad 150. In some embodiments, the drive circuit 125BA can be replaced by a different circuit or a component that can perform the functionalities of the drive circuit 125BA described herein. In one configuration, the drive circuit 125BA includes N-type transistors N71, N72 connected in series between the second metal rail configured to provide the first reference voltage (e.g., VSS or 0V) and the node Out connected to the pad 150. In one configuration, the transistor N71 includes a source electrode coupled to the second metal rail configured to provide the first reference voltage (e.g., VSS or 0V), a gate electrode coupled to an output of the logic circuit I4, and a drain electrode coupled to a source electrode of the transistor N72. In one configuration, the transistor N72 includes a source electrode coupled to the drain electrode of the transistor N71, a gate electrode coupled to an output of the logic circuit I3, and a drain electrode coupled to the node Out. In this configuration, when the first reference voltage (e.g., VSS or 0V) is applied to the gate electrodes of the transistors N71, N72, the transistors N71, N72 may be disabled to not conduct current through the transistors N71, N72. When the second supply voltage (e.g., VDDL or 1.2V) is applied to the gate electrodes of the transistors N71, N72, the transistors N71, N72 may be enabled to conduct current through the transistors N71, N72, to set the voltage of the node Out to be the first reference voltage (e.g., VSS or 0V). In one aspect, the transistors P72, N72 operate as cascode transistors to alleviate voltage stress for the transistors P71, N71.

In some embodiments, the protection circuit 160AA is a circuit or a component that can protect the drive circuit 125AA against an ESD, according to the ESD detection signal 705A. In some embodiments, the protection circuit 160AA can be replaced by a different circuit or a component that can perform the functionalities of the protection circuit 160AA described herein. The ESD detection signal 705A may be a signal corresponding to or generated based on the ESD detection signal 135A. In one aspect, the ESD detection signal 705A may have a voltage shifted from the ESD detection signal 135A. For example, the ESD detection signal 705A may have the first supply voltage (e.g., VDDPST or 1.8V) indicating that an ESD is not detected. For example, the ESD detection signal 705A may have the second reference voltage (e.g., VSSH or 0.5V) indicating that an ESD is detected. In one configuration, the protection circuit 160AA includes a P-type transistor M5 including a source electrode coupled to the first metal rail configured to provide the first supply voltage (e.g., VDDPST or 1.8V), a gate electrode to receive the ESD detection signal 705A, and a drain electrode coupled to the gate electrode of the transistor P71. In this configuration, the protection circuit 160AA may operate in the second power domain between the first supply voltage (e.g., VDDPST or 1.8V) and the second reference voltage (e.g., VSSH or 0.5V). In one aspect, the protection circuit 160AA may enable or disable the transistor P71, according to the ESD detection signal 705A. For example, if the ESD detection signal 705A has the first supply voltage (e.g., VDDPST) indicating that an ESD is not detected, the transistor M5 may be disabled or turned off, such that a signal from the logic circuit I1 can be provided to the gate electrode of the transistor P71. For example, if the ESD detection signal 705A has the second reference voltage (e.g., VSSH or 0.5V) indicating that an ESD is detected, the transistor M5 may be enabled to set a voltage of the gate electrode of the transistor P71 to the first supply voltage (e.g., VDDPST or 1.8V). In response to the voltage of the gate electrode of the transistor P71 being the first supply voltage (e.g., VDDPST or 1.8V), the drive circuit 125AA can be disabled to protect the drive circuit 125AA against an ESD.

In some embodiments, the protection circuit 160BA is a circuit or a component that can protect the drive circuit 125BA against an ESD, according to the ESD detection signal 705B. In some embodiments, the protection circuit 160BA can be replaced by a different circuit or a component that can perform the functionalities of the protection circuit 160BA described herein. The ESD detection signal 705B may be the ESD detection signal 135B or a signal corresponding to the ESD detection signal 135B. In one aspect, the ESD detection signal 705B may have a voltage shifted from the ESD detection signal 135B. For example, the ESD detection signal 705B may have the first reference voltage (e.g., VSS or 0V) indicating that an ESD is not detected. For example, the ESD detection signal 705B may have the second supply voltage (e.g., VDDL or 1.2V) indicating that an ESD is detected. In one configuration, the protection circuit 160BA includes a N-type transistor M6 including a source electrode coupled to the second metal rail configured to provide the first reference voltage (e.g., VSS or 0V), a gate electrode to receive the ESD detection signal 705B, and a drain electrode coupled to the gate electrode of the transistor N71. In this configuration, the protection circuit 160BA may operate in the third power domain between the second supply voltage (e.g., VDDL or 1.2V) and the first reference voltage (e.g., VSS or 0V). In one aspect, the protection circuit 160BA may enable or disable the transistor N71, according to the ESD detection signal 705B. For example, if the ESD detection signal 705B has the second reference voltage (e.g., VSS or 0V) indicating that an ESD is not detected, the transistor M6 may be disabled or turned off, such that a signal from the logic circuit I4 can be provided to the gate electrode of the transistor N71. For example, if the ESD detection signal 705B has the second supply voltage (e.g., VDDL) indicating that an ESD is detected, the transistor M6 may be enabled to set a voltage of the gate electrode of the transistor N71 to the first reference voltage (e.g., VSS or 0V). In response to the voltage of the gate electrode of the transistor N71 being the first reference voltage (e.g., VSS or 0V), the drive circuit 125BA can be disabled to protect the drive circuit 125BA against an ESD.

Figure 7B:
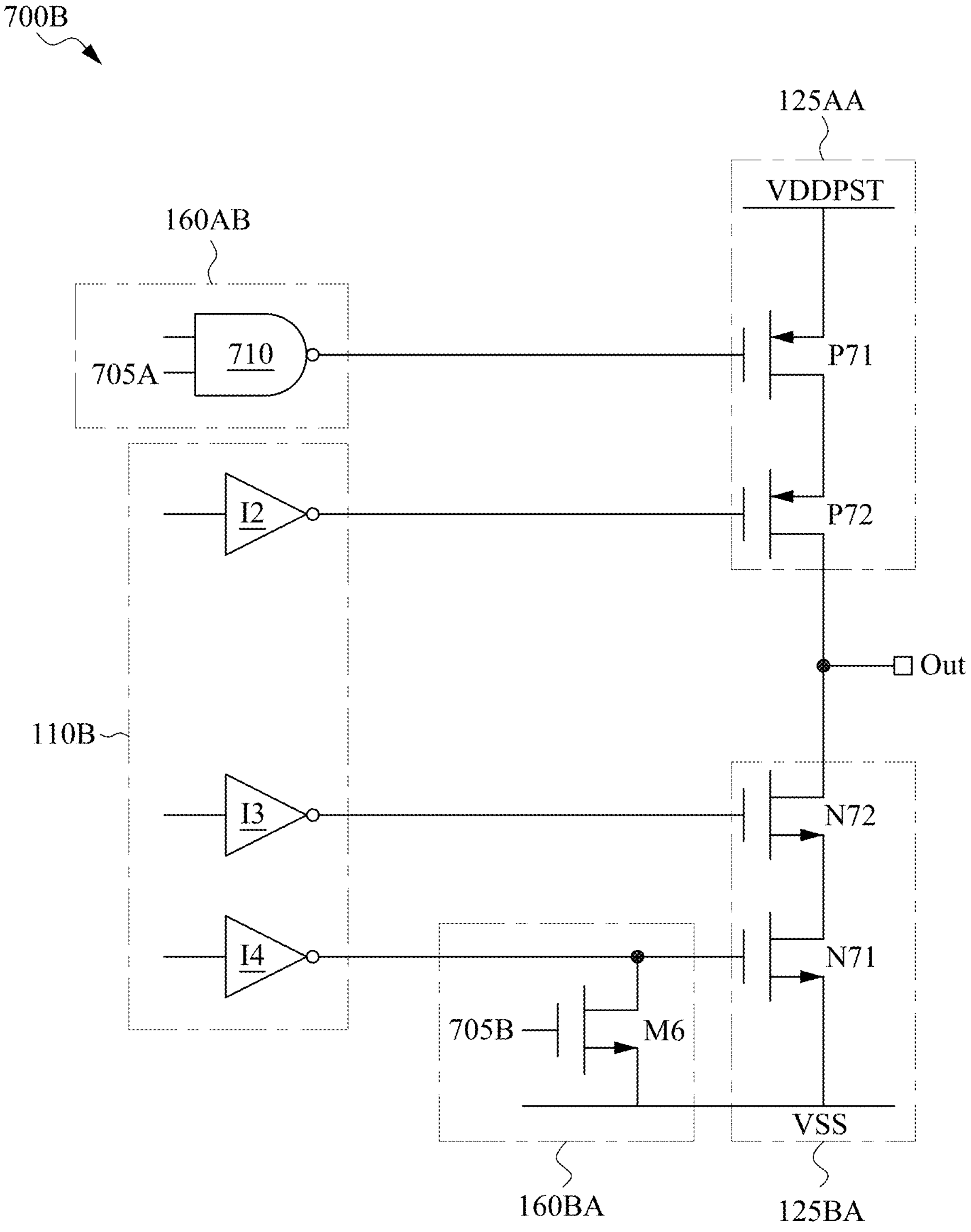

FIG. 7B is a schematic diagram of a portion 700B of an electronic device 100 including a logic circuit 110B, drive circuits 125AA, 125BA, and protection circuits 160AB, 160BA, in accordance with various embodiments. In some embodiments, the portion 700B of the electronic device 100 is similar to the portion 700A of the electronic device 100 in FIG. 7A, except the portion 700B of the electronic device 100 includes the protection circuit 160AB instead of the protection circuit 160AA and includes the logic circuit 110B instead of the logic circuit 110A. The logic circuit 110B may lack the logic circuit I1. Hence, detailed description of duplicated portion thereof is omitted herein for the sake of brevity.

In some embodiments, the protection circuit 160AB includes a NAND gate 710 to disable the transistor P71 in case an ESD occurs. The NAND gate 710 may operate in the second power domain between the first supply voltage (e.g., VDDPST or 1.8V) and the second reference voltage (e.g., VSSH or 0.5V). In one configuration, the NAND gate 710 includes a first input coupled to the logic circuit 110, a second input to receive the ESD detection signal 705A, and an output coupled to a gate electrode of the transistor P71. In one aspect, the protection circuit 160AB may enable or disable the transistor P71, according to the ESD detection signal 705A. For example, if the ESD detection signal 705A has the first supply voltage (e.g., VDDPST or 1.8V) indicating that an ESD is not detected, the NAND gate 710 may generate a signal having an inverted logic state of a signal from the logic circuit 110 and apply the generated signal with the inverted logic state to the gate electrode of the transistor P71. For example, if the ESD detection signal 705A has the second reference voltage (e.g., VSSH or 0.5V) indicating that an ESD is detected, the NAND gate 710 may apply the first supply voltage (e.g., VDDPST or 1.8V) to the gate electrode of the transistor P71. In response to the voltage of the gate electrode of the transistor P71 being the first supply voltage (e.g., VDDPST or 1.8V), the drive circuit 125AA can be disabled to protect the drive circuit 125AA against an ESD.

Figure 7C:
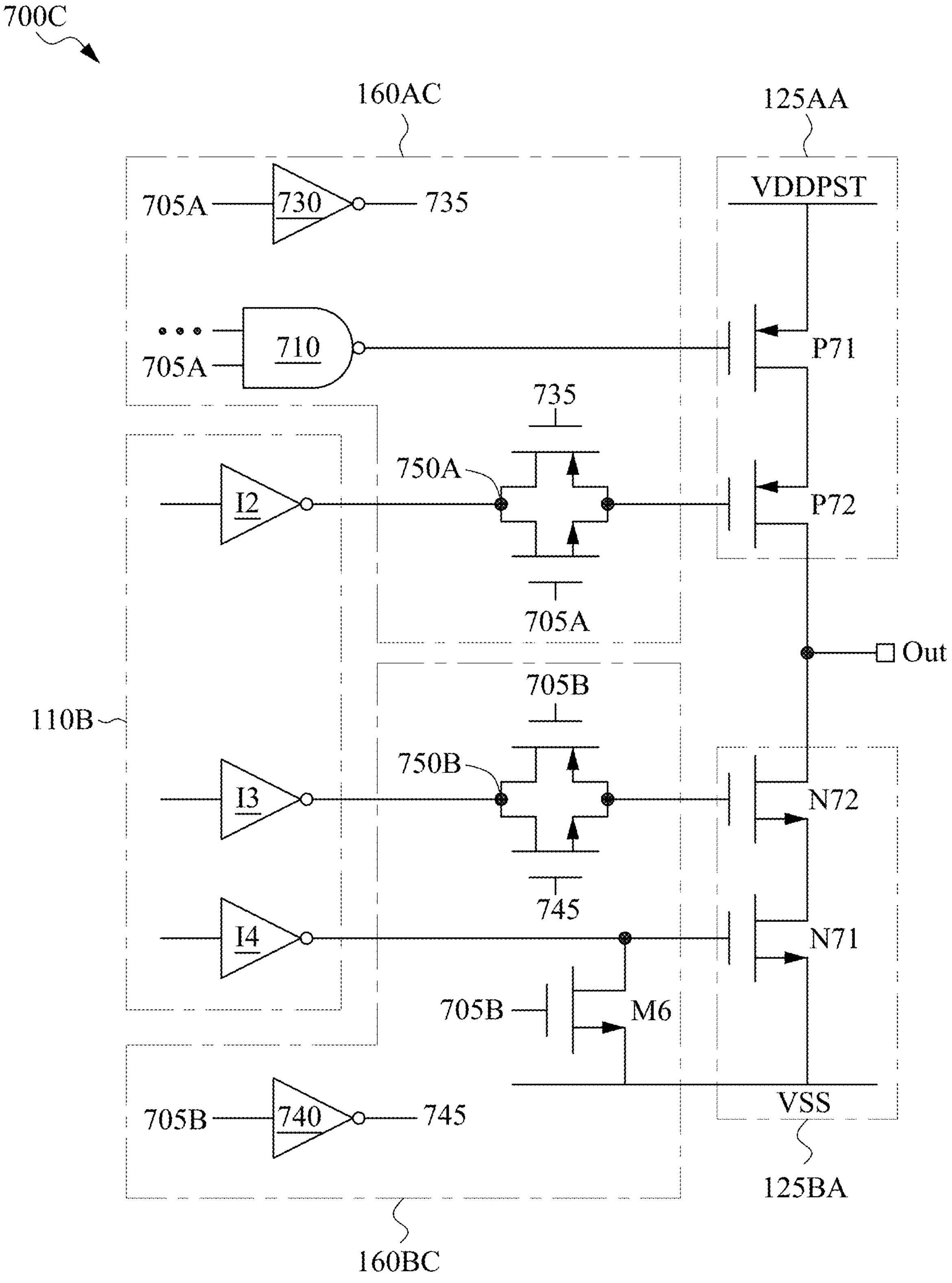

FIG. 7C is a schematic diagram of a portion 700C of an electronic device 100 including a logic circuit 110B, drive circuits 125AA, 125BA, and protection circuits 160AC, 160BC, in accordance with various embodiments. In some embodiments, the portion 700C of the electronic device 100 is similar to the portion 700B of the electronic device 100 in FIG. 7B, except the portion 700C of the electronic device 100 includes the protection circuits 160AC, 160BC instead of the protection circuits 160AB, 160BA. Hence, detailed description of duplicated portion thereof is omitted herein for the sake of brevity.

In some embodiments, the protection circuit 160AC is similar to the protection circuit 160AB, except the protection circuit 160AC includes an inverter 730 and a transmission gate 750A. The inverter 730 and the transmission gate 750A may operate in the second power domain between the first supply voltage (e.g., VDDPST or 1.8V) and the second reference voltage (e.g., VSSH or 0.5V). In one configuration, the inverter 730 includes an input to receive an ESD detection signal 705A, and generates a control signal 735 having an inverted logic state of the ESD detection signal 705A. In one configuration, the transmission gate 750A is coupled between the logic circuit I2 and a gate electrode of the transistor P72 with a control terminal to receive the ESD detection signal 705A and an inverted control terminal to receive the control signal 735. In this configuration, the transmission gate 750A may selectively provide a signal from the logic circuit I2 to the gate electrode of the transistor P72 or electrically float the gate electrode of the transistor P72, according to the ESD detection signal 705A and the control signal 735. For example, in response to the ESD detection signal 705A having the first supply voltage (e.g., VDDPST or 1.8V) indicating that an ESD is not detected, the transmission gate 750A may electrically couple an output of the logic circuit I2 to the gate electrode of the transistor P72. For example, in response to the ESD detection signal 705A having the second reference voltage (e.g., VSSH or 0.5V) indicating that an ESD is detected, the transmission gate 750A may electrically decouple the output of the logic circuit I2 from the gate electrode of the transistor P72, such that the gate electrode of the transistor P72 can be electrically floated. By electrically floating the gate electrode of the transistor P72, the transistor P72 may be disabled.

In one aspect, in case an ESD is detected, the protection circuit 160AC can disable both the transistors P71, P72 to protect the transistors P71, P72. For example, in case an ESD is detected, the NAND gate 710 can turn off the transistor P71 while the transmission gate 750A can electrically float the gate electrode of the transistor P72. By turning off the transistor P71, current may not flow through the transistors P71, P72. Moreover, by electrically floating the gate electrode of the transistor P72, a voltage stress due to an ESD at the pad 150 can be distributed or shared by the disabled transistors P71, P72 to protect the transistors P71, P72.

In some embodiments, the protection circuit 160BC is similar to the protection circuit 160BA, except the protection circuit 160BC includes an inverter 740 and a transmission gate 750B. The inverter 740 and the transmission gate 750B may operate in the third power domain between the second supply voltage (e.g., VDDL or 1.2V) and the first reference voltage (e.g., VSS or 0V). In one configuration, the inverter 740 includes an input to receive the ESD detection signal 705B and generates a control signal 745 having an inverted logic state of the ESD detection signal 705B. In one configuration, the transmission gate 750B is coupled between the logic circuit I3 and a gate electrode of the transistor N72 with a control terminal to receive the control signal 745 and an inverted control terminal to receive the ESD detection signal 705B. In this configuration, the transmission gate 750B may selectively provide a signal from the logic circuit I3 to the gate electrode of the transistor N72 or electrically float the gate electrode of the transistor N72, according to the ESD detection signal 705B and the control signal 745. For example, in response to the ESD detection signal 705B having the first reference voltage (e.g., VSS) indicating that an ESD is not detected, the transmission gate 750B may electrically couple an output of the logic circuit I3 to the gate electrode of the transistor N72. For example, in response to the ESD detection signal 705B having the second supply voltage (e.g., VDDL) indicating that an ESD is detected, the transmission gate 750B may electrically decouple the output of the logic circuit I3 from the gate electrode of the transistor N72, such that the gate electrode of the transistor N72 can be electrically floated. By electrically floating the gate electrode of the transistor N72, the transistor N72 may be disabled.

In one aspect, in case an ESD is detected, the protection circuit 160BC can disable both the transistors N71, N72 to protect the transistors N71, N72. For example, in case an ESD is detected, the transistor M6 can apply the first reference voltage (e.g., VSS) to the gate electrode of the transistor N71 to turn off the transistor N71, while the transmission gate 750B can electrically float the gate electrode of the transistor N72. By turning off the transistor N71, current may not flow through the transistors N71, N72. Moreover, by electrically floating the gate electrode of the transistor N72, a voltage stress due to an ESD at the pad 150 can be distributed or shared by the disabled transistors N71, N72 to protect the transistors N71, N72.

Figure 7D:
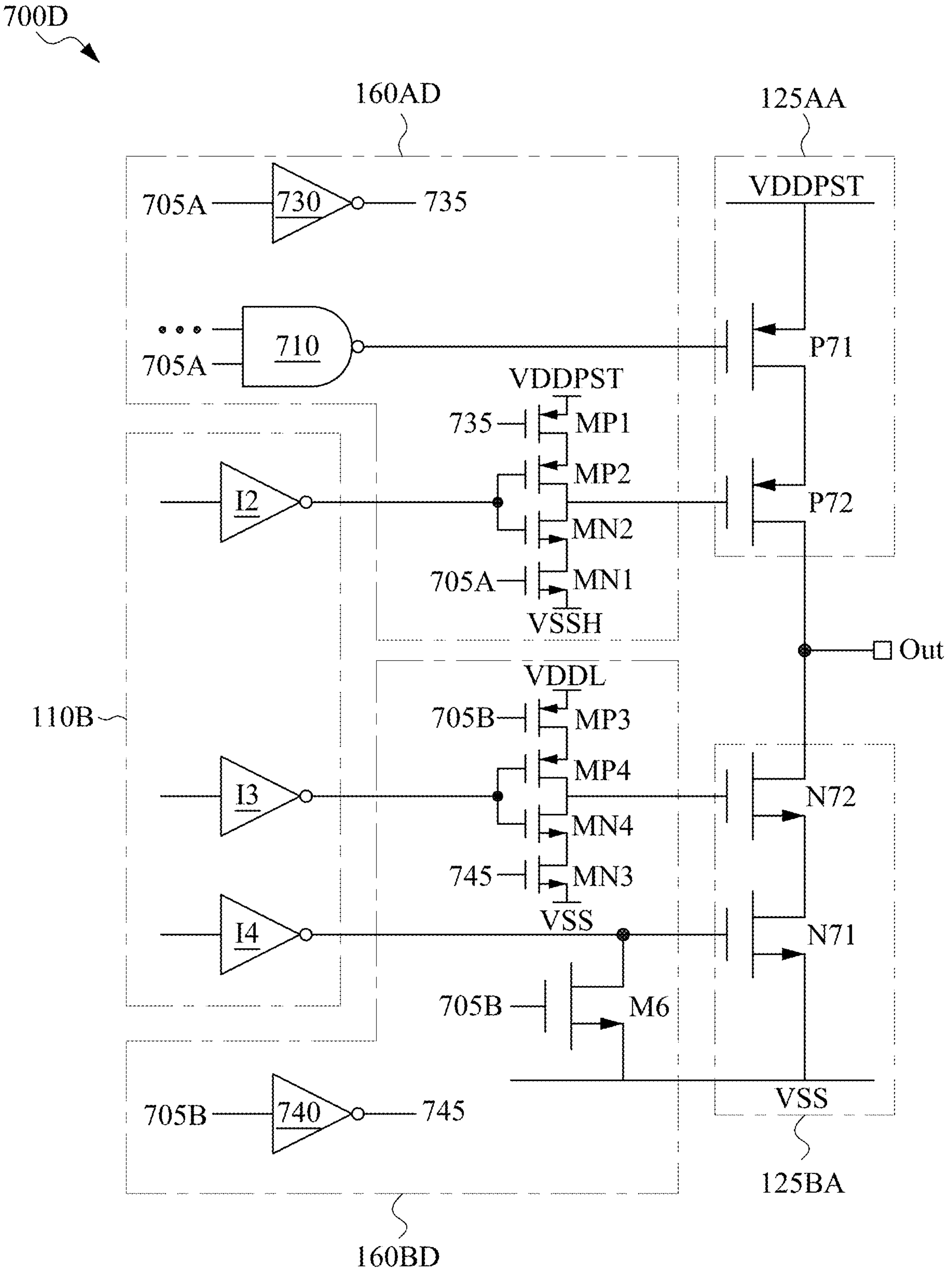

FIG. 7D is a schematic diagram of a portion 700D of an electronic device 100 including a logic circuit 110B, drive circuits 125AA, 125BA, and protection circuits 160AD, 160BD, in accordance with various embodiments. In some embodiments, the portion 700D of the electronic device 100 is similar to the portion 700C of the electronic device 100 in FIG. 7C, except the portion 700D of the electronic device 100 includes the protection circuits 160AD, 160BD instead of the protection circuits 160AC, 160BC. Hence, detailed description of duplicated portion thereof is omitted herein for the sake of brevity.

In some embodiments, the protection circuit 160AD is similar to the protection circuit 160AC, except the protection circuit 160AD includes transistors MP1, MP2, MN2, MN1 connected in series instead of the transmission gate 750A. The transistors MP1, MP2 may be embodied as P-type transistors, and the transistors MN1, MN2 may be embodied as N-type transistors. In one configuration, the transistor MP1 includes a source electrode coupled to the first metal rail to receive the first supply voltage (e.g., VDDPST or 1.8V), a gate electrode to receive the control signal 735, and a drain electrode coupled to a source electrode of the transistor MP2. In one configuration, the transistor MP2 includes the source electrode coupled to the drain electrode of the transistor MP1, a gate electrode coupled to an output of the logic circuit I2, and a drain electrode coupled to a drain electrode of the transistor MN2. In one configuration, the transistor MN1 includes a source electrode coupled to the third metal rail to receive the second reference voltage (e.g., VSSH or 0.5V), a gate electrode to receive the ESD detection signal 705A, and a drain electrode coupled to a source electrode of the transistor MN2. In one configuration, the transistor MN2 includes the source electrode coupled to the drain electrode of the transistor MN1, a gate electrode coupled to an output of the logic circuit I2, and a drain electrode coupled to a drain electrode of the transistor MP2. The drain electrode of the transistor MP2 and the drain electrode of the transistor MN2 may be coupled to the gate electrode of the transistor P72.

In this configuration, the transistors MP1, MP2, MN2, MN1 may operate in a similar manner as the transmission gate 750A. For example, in response to the ESD detection signal 705A having the first supply voltage (e.g., VDDPST or 1.8V) indicating that an ESD is not detected, the transistors MN1, MP1 may be turned on to provide a signal having an inverted logic state of a signal output by the logic circuit I2 to the gate electrode of the transistor P72. For example, in response to the ESD detection signal 705A having the second reference voltage (e.g., VSSH or 0.5V) indicating that an ESD is detected, the transistors MN1, MP1 may be turned off to electrically float the gate electrode of the transistor P72, such that the transistor P72 can be disabled.

In some embodiments, the protection circuit 160BD is similar to the protection circuit 160BC, except the protection circuit 160BD includes transistors MP3, MP4, MN4, MN3 connected in series. The transistors MP3, MP4 may be embodied as P-type transistors, and the transistors MN3, MN4 may be embodied as N-type transistors. In one configuration, the transistor MP3 includes a source electrode coupled to the fourth metal rail to receive the second supply voltage (e.g., VDDL or 1.2V), a gate electrode to receive the ESD detection signal 705B, and a drain electrode coupled to a source electrode of the transistor MP4. In one configuration, the transistor MP4 includes the source electrode coupled to the drain electrode of the transistor MP3, a gate electrode coupled to an output of the logic circuit I3, and a drain electrode coupled to a drain electrode of the transistor MN4. In one configuration, the transistor MN3 includes a source electrode coupled to the second metal rail to receive the first reference voltage (e.g., VSS or 0V), a gate electrode to receive the control signal 745, and a drain electrode coupled to a source electrode of the transistor MN4. In one configuration, the transistor MN4 includes the source electrode coupled to the drain electrode of the transistor MN3, a gate electrode coupled to an output of the logic circuit I3, and a drain electrode coupled to a drain electrode of the transistor MP4. The drain electrode of the transistor MP4 and the drain electrode of the transistor MN4 may be coupled to the gate electrode of the transistor N72.

In this configuration, the transistors MP3, MP4, MN4, MN3 may operate in a similar manner as the transmission gate 750B. For example, in response to the ESD detection signal 705B having the first reference voltage (e.g., VSS or 0V) indicating that an ESD is not detected, the transistors MN3, MP3 may be turned on to provide a signal having an inverted logic state of a signal output by the logic circuit I3 to the gate electrode of the transistor N72. For example, in response to the ESD detection signal 705B having the second supply voltage (e.g., VDDL or 1.2V) indicating that an ESD is detected, the transistors MN3, MP3 may be turned off to electrically float the gate electrode of the transistor N72, such that the transistor N72 can be disabled.

Figure 7E:
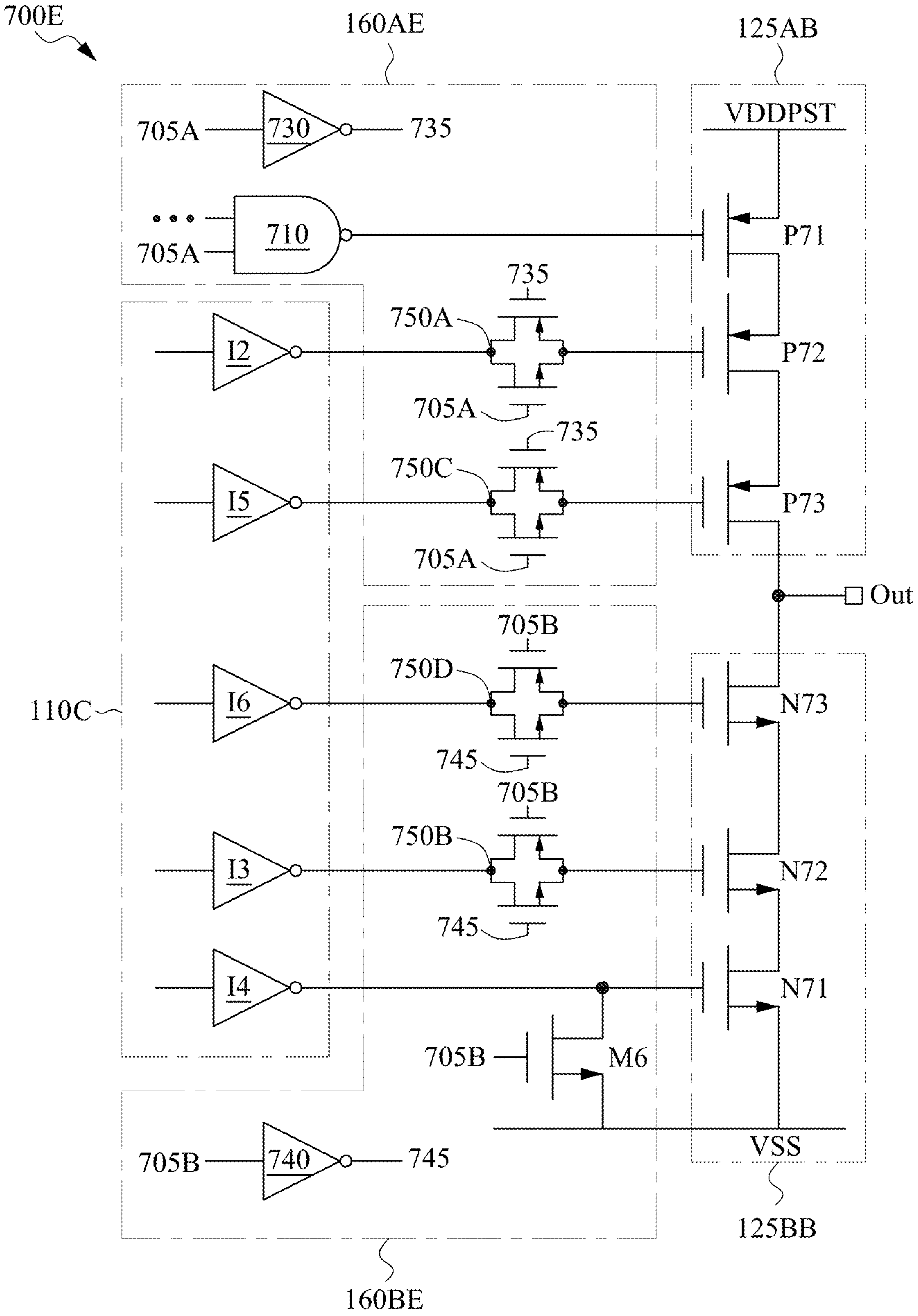

FIG. 7E is a schematic diagram of a portion 700E of an electronic device 100 including a logic circuit 110C, drive circuits 125AB, 125BB, and protection circuits 160AE, 160BE, in accordance with various embodiments. In some embodiments, the portion 700E of the electronic device 100 is similar to the portion 700D of the electronic device 100 in FIG. 7D, except the portion 700E of the electronic device 100 includes i) the protection circuits 160AE, 160BE instead of the protection circuits 160AD, 160BD, ii) the drive circuits 125AB, 125BB instead of the drive circuits 125AA, 125BA, and iii) the logic circuit 110C instead of the logic circuit 110B. Hence, detailed description of duplicated portion thereof is omitted herein for the sake of brevity.

In some embodiments, the drive circuit 125AB is similar to the drive circuit 125AA, except the drive circuit 125AB includes a P-type transistor P73 (or an additional cascode transistor) coupled between the P-type transistor P72 and the node Out. In one aspect, the P-type transistor P73 can further alleviate a voltage stress between the first metal rail configured to provide the first supply voltage (e.g., VDDPST or 1.8V) and the node Out.

In some embodiments, the drive circuit 125BB is similar to the drive circuit 125BA, except the drive circuit 125BB includes an N-type transistor N73 (or an additional cascode transistor) coupled between the N-type transistor N72 and the node Out. In one aspect, the N-type transistor N73 can further alleviate a voltage stress between the second metal rail configured to provide the first reference voltage (e.g., VSS or 0V) and the node Out.

In some embodiments, the logic circuit 110C is similar to the logic circuit 110B, except the logic circuit 110C includes logic circuits I5, I6. In one aspect, the logic circuits I5, I6 may operate based on two different power domains. For example, the logic circuit I5 may operate based on the second power domain to generate signals swinging between the first supply voltage (e.g., VDDPST or 1.8V) and the second reference voltage (e.g., VSSH or 0.5V). For example, the logic circuit I6 may operate based on the third power domain to generate signals swinging between the second supply voltage (e.g., VDDL or 1.2V) and the first reference voltage (e.g., VSS or 0V). The signals output by the logic circuits I2-I6 may be synchronized with each other and represent a data to transmit.

In some embodiments, the protection circuit 160AE is similar to the protection circuit 160AD, except the protection circuit 160AE includes a transmission gate 750C. The transmission gate 750C may be configured and operate in a similar manner as the transmission gate 750A, except the transmission gate 750C is coupled between the logic circuit 15 and the gate electrode of the transistor P73 and the transmission gate 750C can enable or electrically float the transistor P73 instead of the transistor P72. Thus, detailed description of duplicated portion thereof is omitted herein for the sake of brevity.

In some embodiments, the protection circuit 160BE is similar to the protection circuit 160BD, except the protection circuit 160BE includes a transmission gate 750D. The transmission gate 750D may be configured and operate in a similar manner as the transmission gate 750B, except the transmission gate 750D is coupled between the logic circuit 16 and the gate electrode of the transistor N73 and the transmission gate 750D can enable or electrically float the transistor N73 instead of the transistor N72. Thus, detailed description of duplicated portion thereof is omitted herein for the sake of brevity.

Figure 7F:
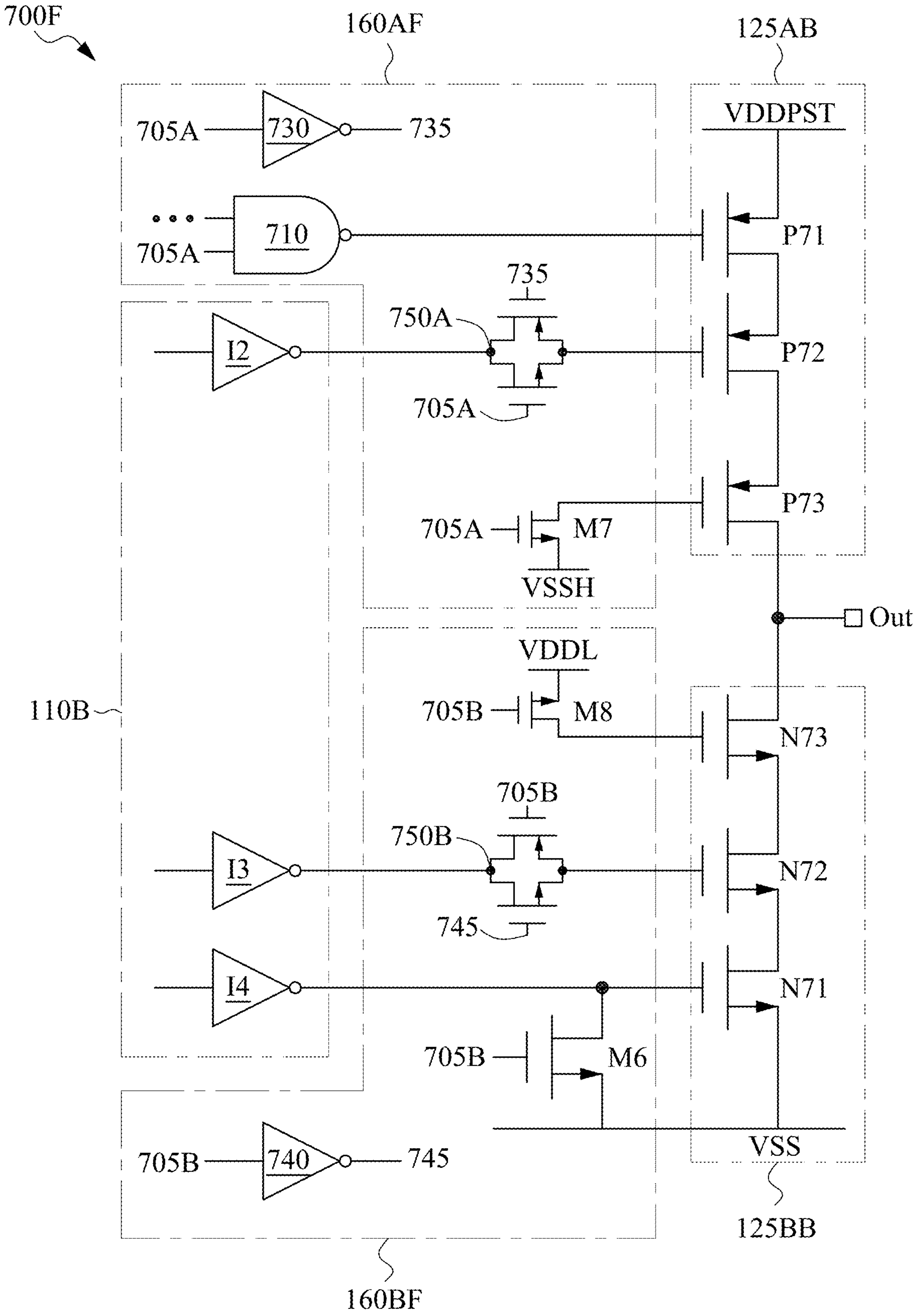

FIG. 7F is a schematic diagram of a portion 700F of an electronic device 100 including a logic circuit 110B, drive circuits 125AB, 125BB, and protection circuits 160AF, 160BF, in accordance with various embodiments. In some embodiments, the portion 700F of the electronic device 100 is similar to the portion 700E of the electronic device 100 in FIG. 7E, except the portion 700F of the electronic device 100 includes i) the protection circuits 160AF, 160BF instead of the protection circuits 160AE, 160BE, and ii) the logic circuit 110B instead of the logic circuit 110C. Hence, detailed description of duplicated portion thereof is omitted herein for the sake of brevity.

In some embodiments, the protection circuit 160AF is similar to the protection circuit 160AE, except the protection circuit 160AF includes a pull-down transistor M7 instead of the transmission gate 750C. The pull-down transistor M7 may be embodied as an N-type transistor including a source electrode coupled to the third metal rail configured to provide the second reference voltage (e.g., VSSH or 0.5V), a gate electrode to receive the ESD detection signal 705A, and a drain electrode coupled to the gate electrode of the transistor P73. In this configuration, the pull-down transistor M7 may apply the second reference voltage (e.g., VSSH or 0.5V) to the gate electrode of the transistor P73 to enable the transistor P73, when the ESD detection signal 705A has the first supply voltage (e.g., VDDPST or 1.8V) indicating that an ESD is not detected. The pull-down transistor M7 may electrically float the gate electrode of the transistor P73, when the ESD detection signal 705A has the second reference voltage (e.g., VSSH or 0.5V) indicating that an ESD is detected. By electrically floating the gate electrode of the transistor P73, the transistors P71, P72, P73 can be disabled when the ESD is detected to alleviate or distribute a voltage stress between the first metal rail configured to provide the first supply voltage (e.g., VDDPST or 1.8V) and the pad 150.

In some embodiments, the protection circuit 160BF is similar to the protection circuit 160BE, except the protection circuit 160BF includes a pull up transistor M8 instead of the transmission gate 750D. The pull up transistor M8 may be embodied as a P-type transistor including a source electrode coupled to the fourth metal rail configured to provide the second supply voltage (e.g., VDDL or 1.2V), a gate electrode to receive the ESD detection signal 705B, and a drain electrode coupled to the gate electrode of the transistor N73. In this configuration, the pull up transistor M8 may apply the second supply voltage (e.g., VDDL or 1.2V) to the gate electrode of the transistor N73 to enable the transistor N73, when the ESD detection signal 705B has the first reference voltage (e.g., VSS or 0V) indicating that an ESD is not detected. The pull up transistor M8 may electrically float the gate electrode of the transistor N73, when the ESD detection signal 705B has the second supply voltage (e.g., VDDL or 1.2V) indicating that an ESD is detected. By electrically floating the gate electrode of the transistor N73, the transistors N71, N72, N73 can be disabled when the ESD is detected to alleviate or distribute a voltage stress between the second metal rail configured to provide the first reference voltage (e.g., VSS or 0V) and the pad 150.

Figure 7G:
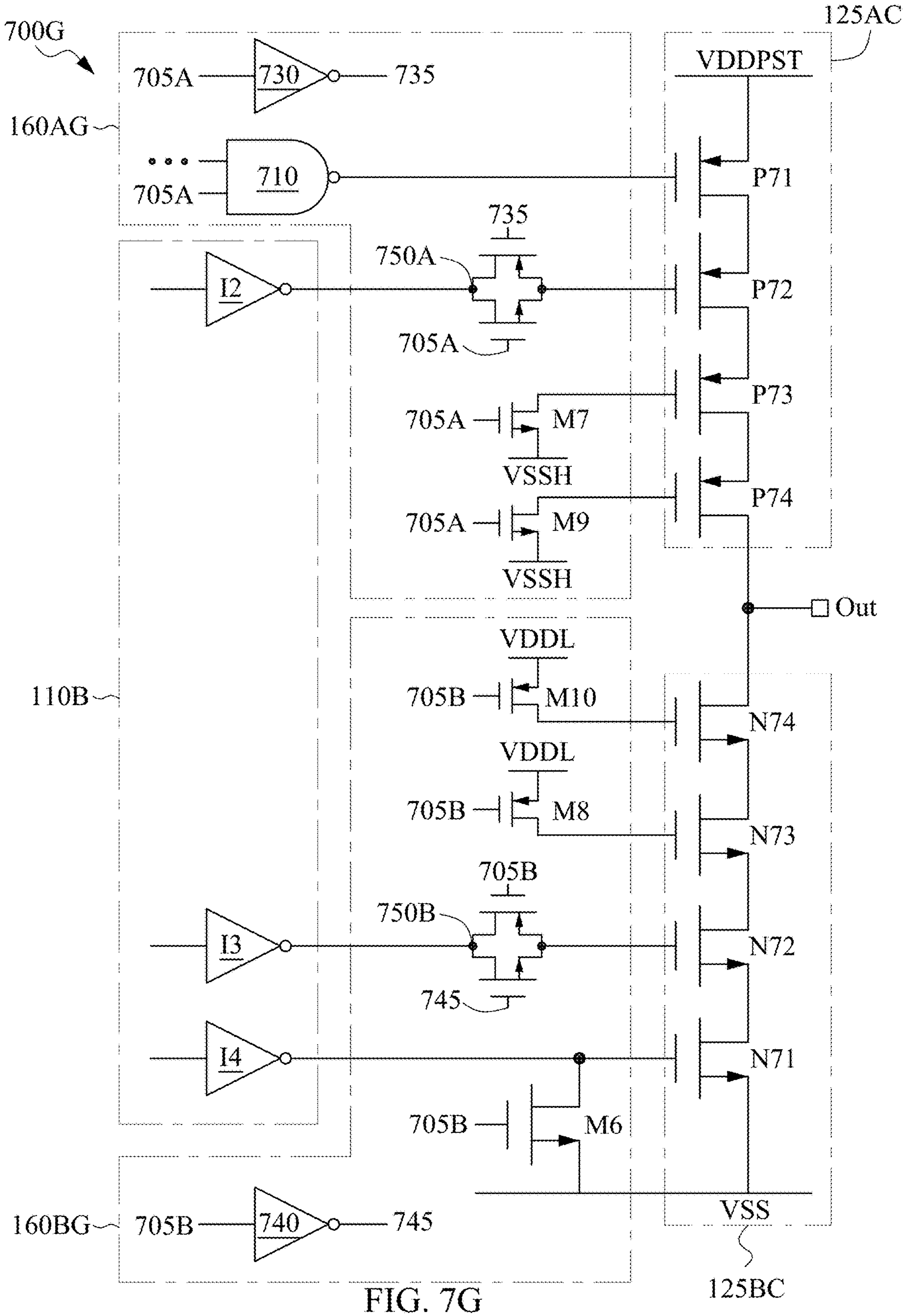

FIG. 7G is a schematic diagram of a portion 700G of an electronic device 100 including a logic circuit 110B, drive circuits 125AC, 125BC, and protection circuits 160AG, 160BG, in accordance with various embodiments. In some embodiments, the portion 700G of the electronic device 100 is similar to the portion 700F of the electronic device 100 in FIG. 7F, except the portion 700G of the electronic device 100 includes i) the protection circuits 160AG, 160BG instead of the protection circuits 160AF, 160BF, and ii) the drive circuits 125AC, 125BC instead of the drive circuits 125AB, 125BB. Hence, detailed description of duplicated portion thereof is omitted herein for the sake of brevity.

In some embodiments, the drive circuit 125AC is similar to the drive circuit 125AB, except the drive circuit 125AC includes a P-type transistor P74 (or an additional cascode transistor) coupled between the P-type transistor P73 and the node Out. In one aspect, the P-type transistor P74 can further alleviate a voltage stress between the first metal rail configured to provide the first supply voltage (e.g., VDDPST or 1.8V) and the node Out.

In some embodiments, the drive circuit 125BC is similar to the drive circuit 125BB, except the drive circuit 125BC includes an N-type transistor N74 (or an additional cascode transistor) coupled between the N-type transistor N73 and the node Out. In one aspect, the N-type transistor N74 can further alleviate a voltage stress between the second metal rail configured to provide the first reference voltage (e.g., VSS or 0V) and the node Out.

In some embodiments, the protection circuit 160AG is similar to the protection circuit 160AF, except the protection circuit 160AG includes a pull-down transistor M9. The pull-down transistor M9 may be configured and operate in a similar manner as the pull-down transistor M7, except the pull down transistor M9 is coupled to the gate electrode of the transistor P74 instead of the transistor P73 and the pull down transistor M9 may enable or electrically float the transistor P74 instead of the transistor P73. Thus, detailed description of duplicated portion thereof is omitted herein for the sake of brevity.

In some embodiments, the protection circuit 160BG is similar to the protection circuit 160BF, except the protection circuit 160BG includes a pull up transistor M10. The pull up transistor M10 may be configured and operate in a similar manner as the pull up transistor M8, except the pull up transistor M10 is coupled to the gate electrode of the transistor N74 instead of the transistor N73 and the pull up transistor M10 may enable or electrically float the transistor N74 instead of the transistor N73. Thus, detailed description of duplicated portion thereof is omitted herein for the sake of brevity.

Figure 8:
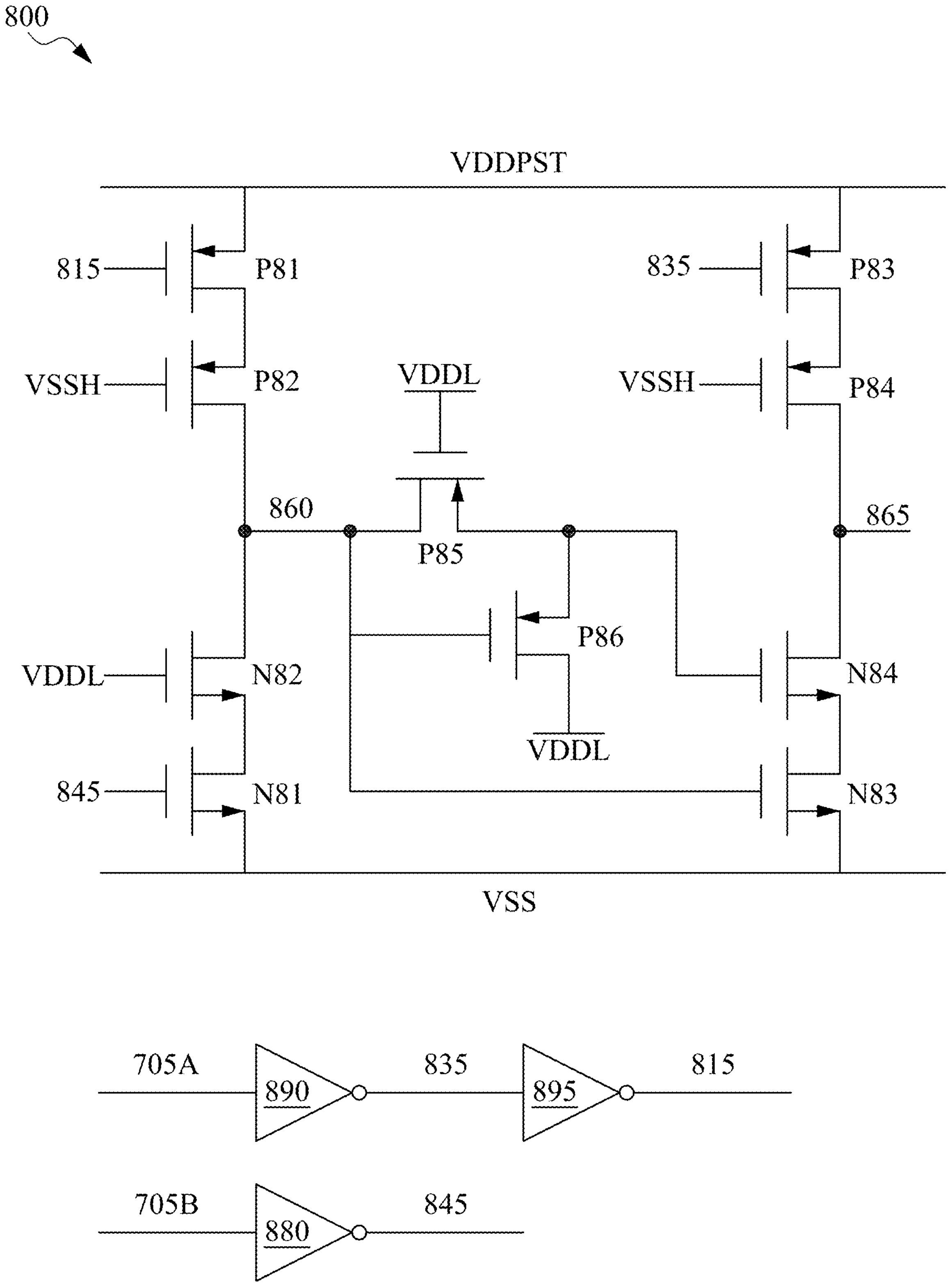
FIG. 8 is a schematic diagram of a buffer circuit, in accordance with some embodiments.

FIG. 8 is a schematic diagram of a buffer circuit 800, in accordance with some embodiments. In some embodiments, the buffer circuit 800 includes P-type transistors P81, P82, P83, P84, P85, P86, N-type transistors N81, N82, N83, N84, and inverters 880, 890, 895. These components may operate together to generate control signals 815, 835, 845, 860, 865, based on the ESD detection signals 705A, 705B or the ESD detection signals 135A, 135B. The buffer circuit 800 may provide one or more of the control signals 815, 835, 845, 860, 865 to the drive circuit 120. In some embodiments, the buffer circuit 800 includes more, fewer, or different components than shown in FIG. 8. For example, some of the inverters 880, 890, 895 may be omitted or replaced by the inverters 730, 740.

In one configuration, the inverter 880 receives the ESD detection signal 705B (or the ESD detection signal 135B) and generates a control signal 845. The inverter 880 may operate in the third power domain between the second supply voltage (e.g., VDDL or 1.2V) and the first reference voltage (e.g., VSS or 0V). In this configuration, the inverter 880 may generate the control signal 845 having an inverted logic state of the ESD detection signal 705B between the second supply voltage (e.g., VDDL or 1.2V) and the first reference voltage (e.g., VSS or 0V).

In one configuration, the inverter 890 receives the ESD detection signal 705A (or the ESD detection signal 135A) and generates a control signal 835. In one configuration, the inverter 895 receives the control signal 835 and generates a control signal 815. The inverters 890, 895 may operate in the second power domain between the first supply voltage (e.g., VDDPST or 1.8V) and the second reference voltage (e.g., VSSH or 0.5V). In this configuration, the inverter 890 may generate the control signal 835 having an inverted logic state of the ESD detection signal 705A between the first supply voltage and the second reference voltage. The inverter 895 may generate the control signal 815 having the same logic state of the ESD detection signal 705A between the first supply voltage and the second reference voltage.

In one configuration, the transistors P81, P82, N82, N81 are connected in series between the first metal rail configured to provide the first supply voltage (e.g., VDDPST or 1.8V) and the first reference voltage (e.g., VSS or 0V). In one configuration, the transistor P81 includes a source electrode coupled to the first metal rail to receive the first supply voltage (e.g., VDDPST or 1.8V), a gate electrode to receive the control signal 815, and a drain electrode coupled to a source electrode of the transistor P82. In one configuration, the transistor P82 includes the source electrode coupled to the drain electrode of the transistor P81, a gate electrode to receive the second reference voltage (e.g., VSSH or 0.5V), and a drain electrode coupled to a drain electrode of the transistor N82. In one configuration, the transistor N81 includes a source electrode coupled to the second metal rail to receive the first reference voltage (e.g., VSS or 0V), a gate electrode to receive the control signal 845, and a drain electrode coupled to a source electrode of the transistor N82. In one configuration, the transistor N82 includes the source electrode coupled to the drain electrode of the transistor N81, a gate electrode to receive the second supply voltage (e.g., VDDL or 1.2V), and a drain electrode coupled to a drain electrode of the transistor P82. At the drain electrodes of the transistors N82, P82, the control signal 860 can be generated. In one aspect, the cascode transistors P82, N82 are implemented to distribute or alleviate a voltage stress between the first metal rail and the second metal rail.

In one configuration, the transistors P83, P84, N84, N83 are connected in series between the first metal rail configured to provide the first supply voltage (e.g., VDDPST or 1.8V) and the first reference voltage (e.g., VSS or 0V). In one configuration, the transistor P83 includes a source electrode coupled to the first metal rail to receive the first supply voltage (e.g., VDDPST or 1.8V), a gate electrode to receive the control signal 835, and a drain electrode coupled to a source electrode of the transistor P84. In one configuration, the transistor P84 includes the source electrode coupled to the drain electrode of the transistor P83, a gate electrode to receive the second reference voltage (e.g., VSSH or 0.5V), and a drain electrode coupled to a drain electrode of the transistor N84. In one configuration, the transistor N83 includes a source electrode coupled to the second metal rail to receive the first reference voltage (e.g., VSS or 0V), a gate electrode to receive the control signal 860, and a drain electrode coupled to a source electrode of the transistor N84. In one configuration, the transistor N84 includes the source electrode coupled to the drain electrode of the transistor N83, a gate electrode coupled to the transistors P85, P86, and a drain electrode coupled to a drain electrode of the transistor P84. At the drain electrodes of the transistors N84, P84, the control signal 865 can be generated. In one aspect, the cascode transistors P84, N84 are implemented to distribute or alleviate a voltage stress between the first metal rail and the second metal rail.

In one configuration, the transistor P85 includes a gate electrode to receive the second supply voltage (e.g., VDDL or 1.2V), a source electrode coupled to the gate electrode of the transistor N84, and a drain electrode coupled to drain electrodes of the transistors P82, N82. In one configuration, the transistor P86 includes a gate electrode coupled to drain electrodes of the transistors P82, N82, a source electrode coupled to the gate electrode of the transistor N84, and a drain electrode to receive the second supply voltage (e.g., VDDL or 1.2V).

In this configuration, the buffer circuit 800 may generate the control signals 815, 835, 845, 860, 865, according to the ESD detection signals 705A, 705B or the ESD detection signals 135A, 135B. For example, in response to the ESD detection signal 705B having the first reference voltage (e.g., VSS or 0V) indicating that an ESD is not detected (or in normal operating mode), the control signal 815 may have the first supply voltage (e.g., VDDPST or 1.8V); the control signal 835 may have the second reference voltage (e.g., VSSH or 0.5V); the control signal 845 may have the second supply voltage (e.g., VDDL or 1.2V); the control signal 860 may have the first reference voltage (e.g., VSS or 0V); and the control signal 865 may have the first supply voltage (e.g., VDDPST or 1.8V). For example, in response to the ESD detection signal 705B having the second supply voltage (e.g., VDDL or 1.2V) indicating that an ESD is detected, the control signal 815 may have the second reference voltage (e.g., VSSH or 0.5V); the control signal 835 may have the first supply voltage (e.g., VDDPST or 1.8V); the control signal 845 may have the first reference voltage (e.g., VSS or 0V); the control signal 860 may have the first supply voltage (e.g., VDDPST or 1.8V); and the control signal 865 may have the first reference voltage (e.g., VSS or 0V).

The buffer circuit 800 may apply the control signals 835, 845, 860, 865 to drive circuit 120 instead of the ESD detection signals 705A, 705B or control signals 735, 745. For example, instead of the control signal 735, the control signal 835 may be applied to the inverted control terminals of the transmission gate 750A, 750C or the gate electrode of the transistor MP1. For example, instead of the control signal 745, the control signal 845 may be applied to the control terminals of the transmission gates 750B, 750D or the gate electrode of the transistor MN3. For example, instead of the ESD detection signal 705A, the control signal 865 may be applied to the control terminals of the transmission gates 750A, 750C, the gate electrodes of the transistors M5, M7, M9, MN1, or the input of the NAND gate 710. For example, instead of the ESD detection signal 705B, the control signal 860 may be applied to the inverted control terminals of the transmission gates 750B, 750D, or the gate electrodes of the transistors M6, M8, M10, MP3.

Figure 9:
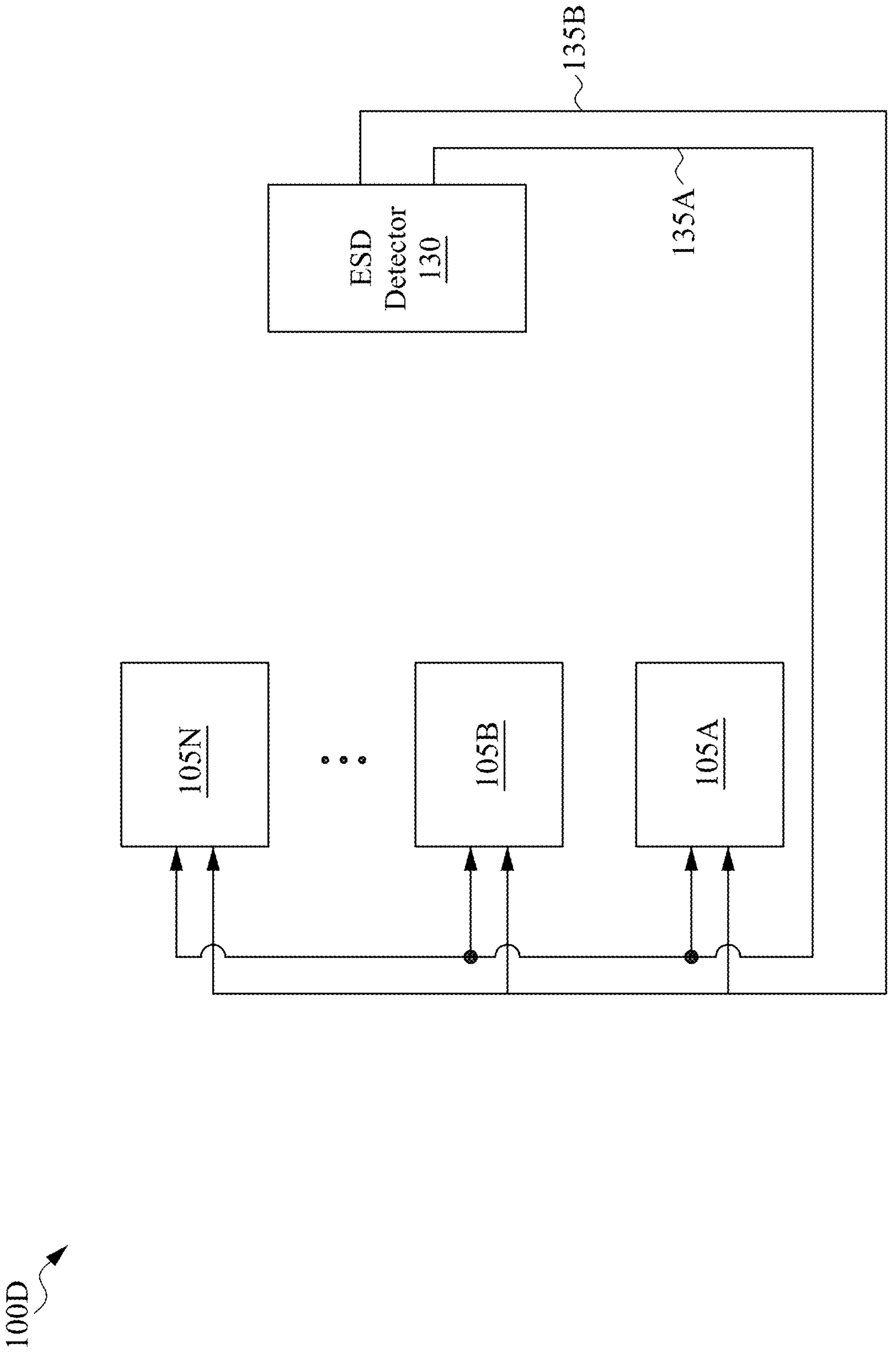
FIG. 9 is a schematic diagram of an electronic device including multiple output cells sharing an ESD detector, in accordance with some embodiments.

FIG. 9 is a schematic diagram of an electronic device 100D including multiple output cells 105A-105N sharing an ESD detector 130, in accordance with some embodiments. Each of the output cells 105A . . . 105N may be the output cell 105 (or IO cell 105). In one aspect, the output cells 105A . . . 105N are connected to a single ESD detector 130. In this configuration, the output cells 105A . . . 105N can be concurrently enabled or disabled, according to the ESD detection signals 135A, 135B from the ESD detector 130. Hence, in case an ESD occurs at a pad 150 of one of the output cells 105A . . . 105N, drive circuits 120 of the output cells 105A . . . 105N can be simultaneously disabled to protect the drive circuits 120 of the output cells 105A . . . 105N.

Figure 10:
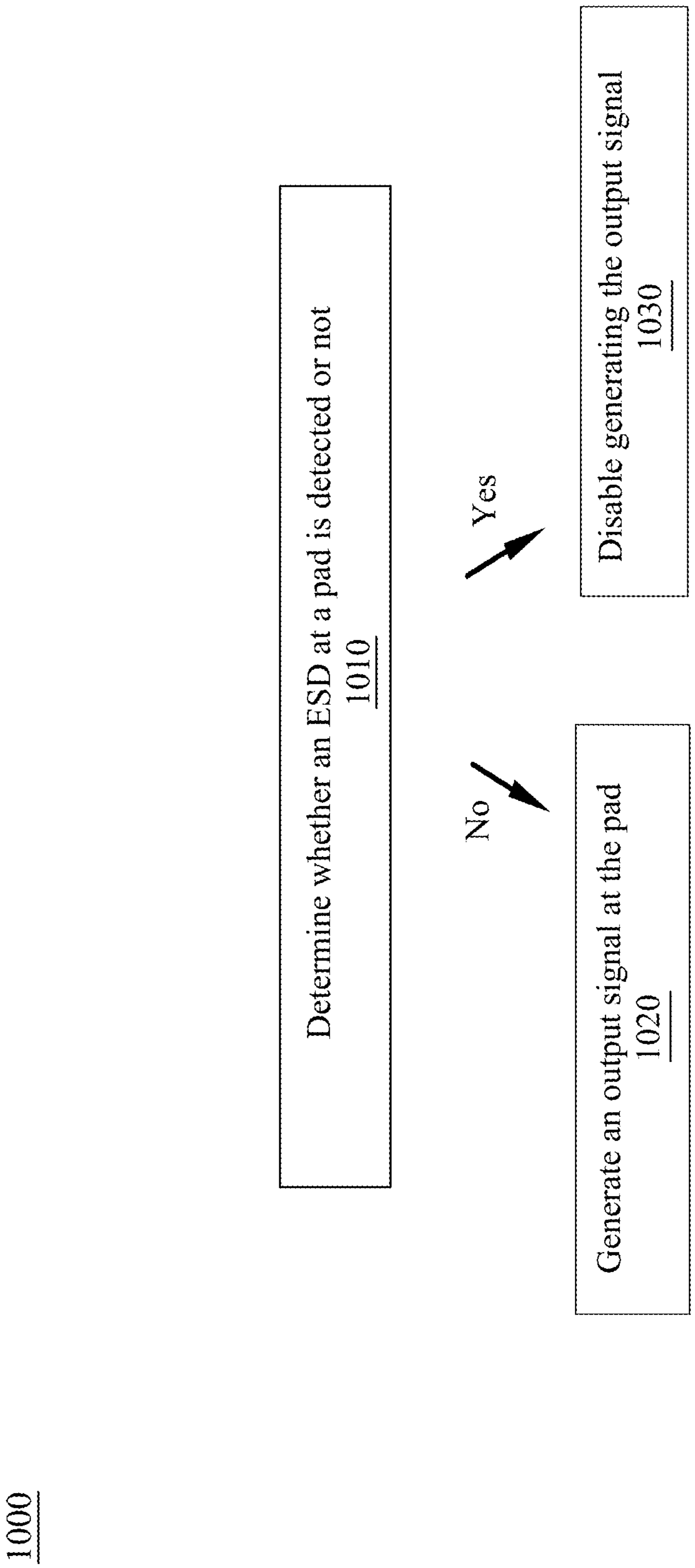
FIG. 10 is a flowchart of a method of protecting an electronic device from an ESD, in accordance with some embodiments.

FIG. 10 is a flowchart of a method 1000 of protecting an electronic device (e.g., electronic device 100) from an ESD, in accordance with some embodiments. The method 1000 may be performed by one or more components of the electronic device 100. In some embodiments, the method 1000 is performed by other entities. In some embodiments, the method 1000 includes more, fewer, or different operations than shown in FIG. 10.

In an operation 1010, an ESD detector (e.g., ESD detector 130 such as ESD detector 130A, ESD detector 130B, or both) determines whether an ESD at a pad (e.g., pad 150) is detected or not. The ESD detector may detect the ESD or an absence of the ESD, according to current discharged through a discharge circuit (e.g., discharge circuit 140) coupled to the pad. For example, the discharge circuit may discharge or conduct current through the pad, i) in response to a voltage of the pad being higher than a sum of a threshold voltage of the discharge circuit and the first voltage (e.g., VDDPST or 1.8V) or ii) in response to a voltage of the pad being lower than a value subtracted from the second voltage (e.g., VSS or 0V) by a threshold voltage of the discharge circuit. In response to the current discharged due to the ESD, a voltage of a metal rail configured to provide a supply voltage (e.g., VDDPST or VDDL) or a reference voltage (e.g., VSS) may change. The ESD detector may detect a change in the voltage of the metal rail, and generate an ESD detection signal (e.g., ESD detection signals 135A, 135B) indicating whether an ESD is detected or not. For example, in response to the change in the voltage of the metal rail being below a threshold level, the ESD detector may determine that an ESD is not detected. For example, in response to the change in the voltage of the metal rail exceeding the threshold level, the ESD detector may determine that an ESD is detected.

In an operation 1020, in response to determining that the ESD is not detected, a drive circuit (e.g., drive circuit 120 including drive circuits 125A and drive circuits 125B) can generate an output signal swinging between a first voltage (e.g., VDDPST or 1.8V) and a second voltage (e.g., VSS or 0V) lower than the first voltage. In one approach, the drive circuit may receive a first signal (e.g., 112A) and a second signal (e.g., 112B) from the logic circuit 110. The first signal may swing between the first voltage (e.g., VDDPST or 1.8V) and a third voltage (e.g., VSSH or 0.5V), and the second signal may swing between a fourth voltage (e.g., VDDL or 1.2V) and the second voltage (e.g., VSS or 0V). In one aspect, the third voltage is between the first voltage and the second voltage. In one aspect, the fourth voltage is between the first voltage and the third voltage. The first signal and the second signal may be synchronized with each other and represent a data to transmit. In one aspect, a protection circuit (e.g., protection circuits 160A, 160B) enables the drive circuit to generate the output signal, in response to the absence of the ESD detected. For example, the protection circuit may allow the drive circuit to receive the first signal and the second signal from the logic circuit, in response to the ESD detection signal indicating that the ESD is not detected. In one aspect, the driver circuit can generate the output signal according to the first signal and the second signal, in response to the ESD detection signal indicating that the ESD is not detected. For example, in response to the first signal, the drive circuit may generate the first voltage (e.g., VDDPST or 1.8V) of the output signal. For example, in response to the second signal, the drive circuit may generate the second voltage (e.g., VSS or 0V) of the output signal. Hence, the driver circuit may generate the output signal having an amplitude larger than an amplitude of the first signal and an amplitude of the second signal.

In an operation 1030, in response to determining that an ESD is detected, a protection circuit (e.g., protection circuits 160A, 160B) disables the drive circuit from generating the output signal. For example, the protection circuit may apply a bias voltage to turn off transistors of the drive circuit and/or electrically float gate electrodes of transistors of the drive circuit, in response to the ESD detection signal indicating that the ESD is detected. By disabling the drive circuit, a voltage stress due to an ESD at the pad 150 can be distributed or shared by the transistors of the drive circuit to protect the drive circuit.

Figure 11:
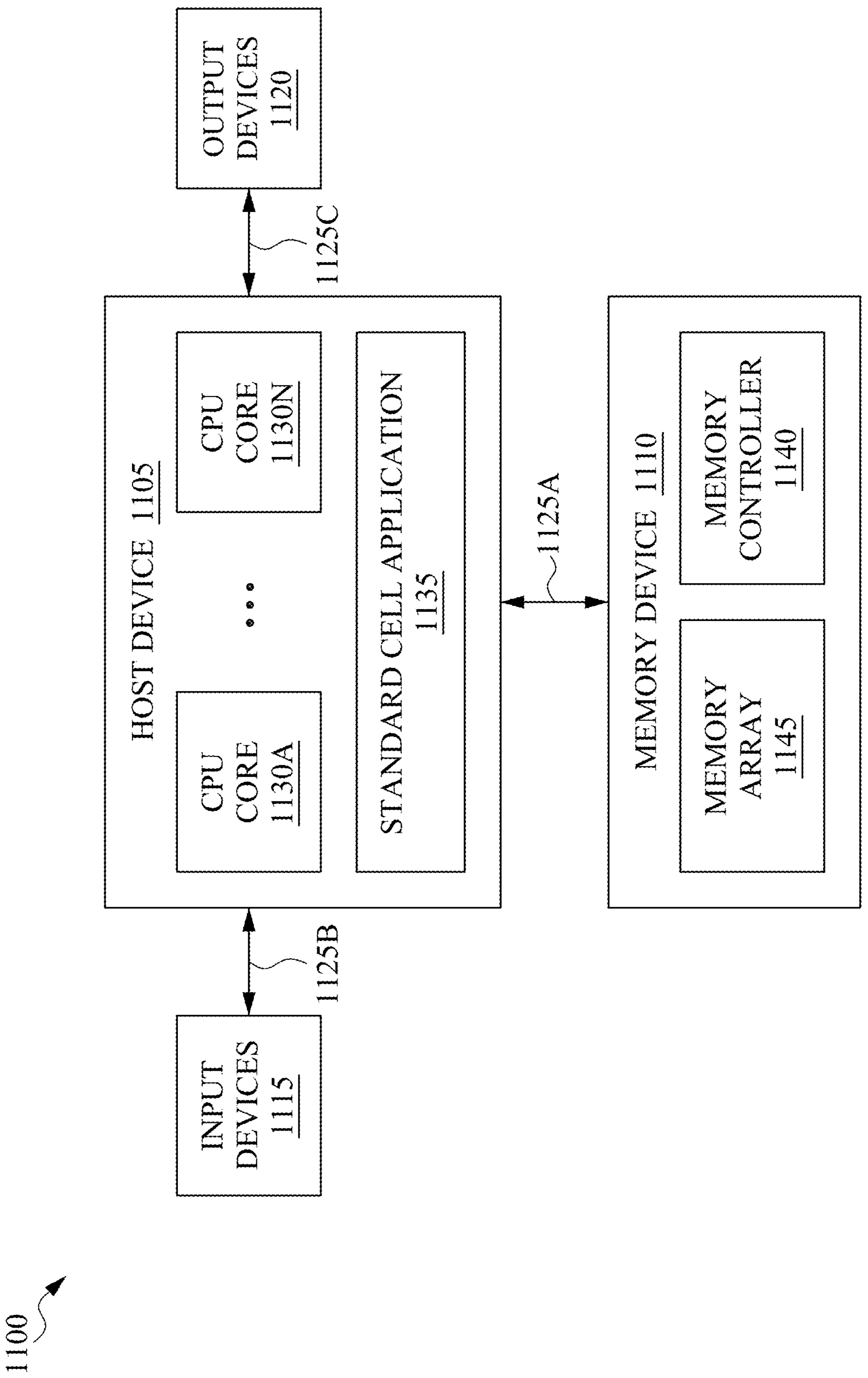
FIG. 11 is an example block diagram of a computing system, in accordance with some embodiments.

Referring now to FIG. 11, an example block diagram of a computing system 1100 is shown, in accordance with some embodiments of the disclosure. The computing system 1100 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1100 includes a host device 1105 associated with a memory device 1110. The host device 1105 may be configured to receive input from one or more input devices 1115 and provide output to one or more output devices 1120. The host device 1105 may be configured to communicate with the memory device 1110, the input devices 1115, and the output devices 1120 via appropriate interfaces 1125A, 1125B, and 1125C, respectively. The computing system 1100 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1105.

The input devices 1115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1105 and that allows an external source, such as a user (e.g., a circuit or layout designer), to enter information (e.g., data) into the host device and send instructions to the host device. Similarly, the output devices 1120 may include a variety of output technologies such as external memories, printers, speakers, displays, microphones, light emitting diodes, headphones, video devices, and any other output peripherals that are configured to receive information (e.g., data) from the host device 1105. The "data" that is either input into the host device 1105 and/or output from the host device may include any of a variety of textual data, circuit data, signal data, semiconductor device data, graphical data, combinations thereof, or other types of analog and/or digital data that is suitable for processing using the computing system 1100.

The host device 1105 includes or is associated with one or more processing units/processors, such as Central Processing Unit ("CPU") cores 1130A-1130N. The CPU cores 1130A-1130N may be implemented as an Application Specific Integrated Circuit ("ASIC"), Field Programmable Gate Array ("FPGA"), or any other type of processing unit. Each of the CPU cores 1130A-1130N may be configured to execute instructions for running one or more applications of the host device 1105. In some embodiments, the instructions and data to run the one or more applications may be stored within the memory device 1110. The host device 1105 may also be configured to store the results of running the one or more applications within the memory device 1110. Thus, the host device 1105 may be configured to request the memory device 1110 to perform a variety of operations. For example, the host device 1105 may request the memory device 1110 to read data, write data, update or delete data, and/or perform management or other operations. One such application that the host device 1105 may be configured to run may be a standard cell application 1135. The standard cell application 1135 may be part of a computer aided design or electronic design automation software suite that may be used by a user of the host device 1105 to use, create, or modify a standard cell of a circuit. In some embodiments, the instructions to execute or run the standard cell application 1135 may be stored within the memory device 1110. The standard cell application 1135 may be executed by one or more of the CPU cores 1130A-1130N using the instructions associated with the standard cell application from the memory device 1110. In one example, the standard cell application 1135 allows a user to utilize pre-generated schematic and/or layout designs of an output cell 105 and/or an ESD detector 130 to aid integrated circuit design. After the layout design of the integrated circuit is complete, multiples of the integrated circuit, for example, including the output cell 105 and/or the ESD detector 130 can be fabricated according to the layout design by a fabrication facility.

Referring still to FIG. 11, the memory device 1110 includes a memory controller 1140 that is configured to read data from or write data to a memory array 1145. The memory array 1145 may include a variety of volatile and/or non-volatile memories. For example, in some embodiments, the memory array 1145 may include NAND flash memory cores. In other embodiments, the memory array 1145 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1145 may be individually and independently controlled by the memory controller 1140. In other words, the memory controller 1140 may be configured to communicate with each memory within the memory array 1145 individually and independently. By communicating with the memory array 1145, the memory controller 1140 may be configured to read data from or write data to the memory array in response to instructions received from the host device 1105. Although shown as being part of the memory device 1110, in some embodiments, the memory controller 1140 may be part of the host device 1105 or part of another component of the computing system 1100 and associated with the memory device. The memory controller 1140 may be implemented as a logic circuit in either software, hardware, firmware, or combination thereof to perform the functions described herein. For example, in some embodiments, the memory controller 1140 may be configured to retrieve the instructions associated with the standard cell application 1135 stored in the memory array 1145 of the memory device 1110 upon receiving a request from the host device 1105.

It is to be understood that only some components of the computing system 1100 are shown and described in FIG. 11. However, the computing system 1100 may include other components such as various batteries and power sources, networking interfaces, routers, switches, external memory systems, controllers, etc. Generally speaking, the computing system 1100 may include any of a variety of hardware, software, and/or firmware components that are needed or considered desirable in performing the functions described herein. Similarly, the host device 1105, the input devices 1115, the output devices 1120, and the memory device 1110 including the memory controller 1140 and the memory array 1145 may include other hardware, software, and/or firmware components that are considered necessary or desirable in performing the functions described herein.

One aspect of this description relates to a device. In some embodiments, the device includes an electrostatic discharge (ESD) detector to detect an ESD at a pad. In some embodiments, the device includes a drive circuit including P-type transistors and N-type transistors connected in series with each other. In some embodiments, the drive circuit is configured to provide an output signal swinging between a first supply voltage and a first reference voltage to the pad. In some embodiments, the device includes a first protection circuit operating in a power domain between the first supply voltage and a second reference voltage. In response to the ESD detected by the ESD detector, the first protection circuit may be configured to disable the P-type transistors. In some embodiments, the device includes a second protection circuit operating in another power domain between a second supply voltage and the first reference voltage. In response to the ESD detected by the ESD detector, the second protection circuit may be configured to disable the N-type transistors.

One aspect of this description relates to a device. In some embodiments, the device includes an ESD detector to detect an ESD at a pad. In some embodiments, the device includes a first drive circuit electrically coupled between a first metal rail and the pad. The first metal rail may be configured to provide a first supply voltage. In some embodiments, the device includes a second drive circuit electrically coupled between a second metal rail and the pad. The second metal rail may be configured to provide a first reference voltage. In some embodiments, the device includes a first bias control circuit electrically coupled between the first metal rail and a third metal rail. The third metal rail may be configured to provide a second reference voltage. The first bias control circuit may be configured to set a first bias voltage of the first drive circuit to protect the first drive circuit from the ESD, in response to the ESD detected by the ESD detector. In some embodiments, the device includes a second bias control circuit electrically coupled between the second metal rail and a fourth metal rail. The fourth metal rail may be configured to provide a second supply voltage. The second bias control circuit may be configured to set a second bias voltage of the second drive circuit to protect the second drive circuit from the ESD, in response to the ESD detected by the ESD detector.

One aspect of this description relates to a method of protection against an ESD. In some embodiments, the method includes detecting, by an ESD detector, an absence of an ESD at a pad. In some embodiments, the method includes generating, by a drive circuit, in response to detecting the absence of the ESD at the pad, an output signal swinging between a first voltage and a second voltage lower than the first voltage, according to i) a first signal swinging between the first voltage and a third voltage and ii) a second signal swinging between a fourth voltage and the second voltage. In one aspect, the third voltage is between the first voltage and the second voltage. In one aspect, the fourth voltage is between the first voltage and the third voltage. In some embodiments, the method includes detecting, by the ESD detector, the ESD at the pad. In some embodiments, the method includes disabling, by a protection circuit, in response to detecting the ESD at the pad, the drive circuit from generating the output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

an electrostatic discharge (ESD) detector to detect an ESD at a pad;

a drive circuit configured to provide the pad with an output signal, and including a first portion and a second portion connected in series with each other, wherein the output signal swinging between a first supply voltage and a first reference voltage;

a first protection circuit operating in a first power domain between the first supply voltage and a second reference voltage, and configured to disable the first portion of the drive circuit, in response to the ESD detected by the ESD detector; and a second protection circuit operating in a second power domain between a second supply voltage and the first reference voltage, and configured to disable the second portion of the drive circuit, in response to the ESD detected by the ESD detector.

2. The device of claim 1, wherein the first portion of the drive circuit includes a plurality of P-type transistors connected in series with each other, and the second portion of the drive circuit includes a plurality of N-type transistors connected in series with each other.

3. The device of claim 2, wherein the P-type transistors are connected in series between the pad and a first metal rail, the first metal rail to provide the first supply voltage; and wherein the N-type transistors are connected in series between the pad and a second metal rail, the second metal rail to provide the first reference voltage.

4. The device of claim 3, wherein the first protection circuit includes a first transistor configured to apply the first supply voltage to a gate electrode of one of the P-type transistors, in response to the ESD detected by the ESD detector; and wherein the second protection circuit includes a second transistor configured to apply the first reference voltage to a gate electrode of one of the N-type transistors, in response to the ESD detected by the ESD detector.

5. The device of claim 4, wherein the first protection circuit includes a first transmission gate to electrically float a gate electrode of another one of the P-type transistors, in response to the ESD detected by the ESD detector; and wherein the second protection circuit includes a second transmission gate to electrically float a gate electrode of another one of the N-type transistors, in response to the ESD detected by the ESD detector.

6. The device of claim 1, wherein the first protection circuit is configured to enable the first portion of the drive circuit to generate the output signal, in response to the ESD not detected by the ESD detector; and wherein the second protection circuit is configured to enable the second portion of the drive circuit to generate the output signal, in response to the ESD not detected by the ESD detector.

7. The device of claim 1, further comprising:

a first logic circuit configured to provide a first signal swinging between the first supply voltage and the second reference voltage to the first portion of the drive circuit.

8. The device of claim 1, further comprising:

a second logic circuit to provide a second signal swinging between the second supply voltage and the first reference voltage to the second portion of the drive circuit.

9. The device of claim 8, wherein the first portion of the drive circuit and the second portion of the drive circuit are configured to generate the output signal swinging between the first supply voltage and the first reference voltage, according to the first signal and the second signal, while the first and second portions of the drive circuit are enabled.

10. The device of claim 1, wherein the ESD detector operates in an additional power domain between the first supply voltage and the first reference voltage.

11. The device of claim 10, further comprising:

a first discharge circuit coupled between the pad and a first metal rail, the first metal rail to provide the first supply voltage; and a second discharge circuit coupled between the pad and a second metal rail, the second metal rail to provide the first reference voltage;

wherein the ESD detector is configured to detect the ESD at the pad, according to a first current through the first discharge circuit or a second current through the second discharge circuit.

12. The device of claim 11, wherein the first discharge circuit includes one or more diodes connected in series between the first metal rail and the pad, wherein the second discharge circuit includes one or more diodes connected in series between the pad and the second metal rail.

13. The device of claim 1, wherein the ESD detector operates in the another power domain between the second supply voltage and the first reference voltage.

14. The device of claim 13, further comprising:

a first discharge circuit coupled between the pad and a first metal rail, the first metal rail to provide the second supply voltage; and a second discharge circuit coupled between the pad and a second metal rail, the second metal rail to provide the first reference voltage, wherein the ESD detector is to detect an ESD at the pad, according to a first current through the first discharge circuit or a second current through the second discharge circuit.

15. A device comprising:

an electrostatic discharge (ESD) detector to detect an ESD at a pad;

a drive circuit configured to provide the pad with an output signal, and including a first portion and a second portion connected in series with each other;

a first protection circuit operating in a first power domain, and configured to disable the first portion of the drive circuit, in response to the ESD detected by the ESD detector; and a second protection circuit operating in a second power domain, and configured to disable the second portion of the drive circuit, in response to the ESD detected by the ESD detector.

16. The device of claim 15, wherein the output signal swinging between a first supply voltage and a first reference voltage, the first power domain is between the first supply voltage and a second reference voltage, and the second power domain is between a second supply voltage and the first reference voltage.

17. The device of claim 15, wherein the first portion of the drive circuit includes a plurality of P-type transistors connected in series with each other, and the second portion of the drive circuit includes a plurality of N-type transistors connected in series with each other.

18. The device of claim 15, wherein the first protection circuit is configured to enable the first portion of the drive circuit to generate the output signal, in response to the ESD not detected by the ESD detector; and wherein the second protection circuit is configured to enable the second portion of the drive circuit to generate the output signal, in response to the ESD not detected by the ESD detector.

19. A device, comprising:

an electrostatic discharge (ESD) detector to detect an ESD at a pad;

a drive circuit configured to provide the pad with an output signal, and including a first portion and a second portion connected in series with each other, wherein the output signal swinging between a first supply voltage and a first reference voltage;

a first protection circuit operating in a first power domain between the first supply voltage and a second reference voltage, wherein the first protection circuit is configured to disable the first portion of the drive circuit, in response to the ESD detected by the ESD detector, and enable the first portion of the drive circuit to generate the output signal, in response to the ESD not detected by the ESD detector; and a second protection circuit operating in a second power domain between a second supply voltage and the first reference voltage, wherein the second protection circuit is configured to disable the second portion of the drive circuit, in response to the ESD detected by the ESD detector, and enable the second portion of the drive circuit to generate the output signal, in response to the ESD not detected by the ESD detector.

20. The device of claim 19, wherein the first portion of the drive circuit includes a plurality of P-type transistors connected in series with each other, and the second portion of the drive circuit includes a plurality of N-type transistors connected in series with each other.

* * * * *